(12) United States Patent
Hori et al.

(10) Patent No.: US 12,183,862 B2
(45) Date of Patent: Dec. 31, 2024

(54) LIGHT EMITTING DEVICE

(71) Applicant: NICHIA CORPORATION, Anan (JP)

(72) Inventors: Akira Hori, Tokushima (JP);
Tomokazu Maruyama, Anan (JP)

(73) Assignee: NICHIA CORPORATION, Anan (JP)

( * ) Notice: Subject to any disclaimer, the term of this patent is extended or adjusted under 35 U.S.C. 154(b) by 428 days.

(21) Appl. No.: 17/709,250

(22) Filed: Mar. 30, 2022

(65) Prior Publication Data

US 2022/0320388 A1 Oct. 6, 2022

(30) Foreign Application Priority Data

Mar. 31, 2021 (JP) ................. 2021-060143

(51) Int. Cl.
*H01L 33/58* (2010.01)
*H01L 33/50* (2010.01)

(52) U.S. Cl.
CPC ............ *H01L 33/58* (2013.01); *H01L 33/505* (2013.01); *H01L 33/508* (2013.01); *H01L 2933/0041* (2013.01); *H01L 2933/0058* (2013.01)

(58) Field of Classification Search
CPC ...... H01L 33/58; H01L 33/505; H01L 33/508
See application file for complete search history.

(56) References Cited

U.S. PATENT DOCUMENTS

| | | | |
|---|---|---|---|
| 9,543,486 B1* | 1/2017 | Lin | ........................ H01L 33/50 |
| 11,063,192 B2* | 7/2021 | Tamaki | ................. H01L 33/50 |
| 2010/0006877 A1* | 1/2010 | Chen | .................. G02B 19/0028 |
| | | | 257/98 |
| 2010/0012957 A1* | 1/2010 | Lin | ....................... H01L 33/507 |
| | | | 257/E33.056 |
| 2011/0297980 A1 | 12/2011 | Sugizaki et al. | |
| 2012/0019123 A1* | 1/2012 | Furukawa | ............... H01L 33/58 |
| | | | 313/483 |
| 2012/0126267 A1* | 5/2012 | Jung | ....................... H01L 33/58 |
| | | | 257/E33.059 |

(Continued)

FOREIGN PATENT DOCUMENTS

| | | |
|---|---|---|
| JP | 2011-253998 A | 12/2011 |
| JP | 2013-012545 A | 1/2013 |

(Continued)

*Primary Examiner* — Nathan W Ha

(74) *Attorney, Agent, or Firm* — Global IP Counselors, LLP

(57) ABSTRACT

A method of manufacturing a light emitting device including: providing an intermediate structure including an light emitting element and a support body; securing a plate-shaped intermediate resin member and the light emitting element with a light-transmissive member such that the intermediate resin member includes first resin extended portions extending outwardly in the first direction respectively from both short sides of the light emitting element in a plan view; cutting the intermediate resin member at cutting positions along the second direction to obtain a resin member with a concave lower surface, a maximum distance from the light emitting element to a respective one of the cutting positions in the first direction being longer than a maximum length of the light emitting element in the second direction; and forming a covering member to cover lateral surfaces of the resin member such that an upper surface of the resin member is exposed.

20 Claims, 14 Drawing Sheets

(56) References Cited

U.S. PATENT DOCUMENTS

| | | | |
|---|---|---|---|
| 2012/0181559 A1* | 7/2012 | Park | H01L 33/58 257/E33.061 |
| 2013/0056781 A1* | 3/2013 | Suenaga | H01L 33/58 257/E33.061 |
| 2013/0126913 A1* | 5/2013 | Hwu | H01L 25/0753 257/E33.012 |
| 2013/0234190 A1* | 9/2013 | Kim | H01L 33/52 257/98 |
| 2013/0240931 A1* | 9/2013 | Akimoto | H01L 33/22 257/98 |
| 2013/0337591 A1* | 12/2013 | Chen | H01L 33/52 257/E33.072 |
| 2014/0103798 A1* | 4/2014 | Yamanaka | H05B 33/04 313/512 |
| 2014/0203305 A1* | 7/2014 | Kawano | H01L 33/486 438/28 |
| 2014/0247578 A1* | 9/2014 | Chen | H01L 25/0753 362/84 |
| 2014/0284652 A1* | 9/2014 | Shimada | H01L 33/56 438/28 |
| 2014/0319562 A1* | 10/2014 | Li | H01L 33/58 257/98 |
| 2014/0355273 A1* | 12/2014 | Saito | G02B 3/08 362/327 |
| 2014/0361200 A1* | 12/2014 | Rudmann | H01L 25/50 250/578.1 |
| 2015/0129914 A1* | 5/2015 | Tien | H01L 33/58 257/98 |
| 2015/0188004 A1* | 7/2015 | Ozeki | H01L 25/0753 438/27 |
| 2015/0263065 A1* | 9/2015 | Inoue | H01L 25/0753 438/27 |
| 2015/0270450 A1* | 9/2015 | Kuroki | H01L 33/507 438/27 |
| 2015/0364656 A1* | 12/2015 | Wang | H01L 33/58 438/27 |
| 2016/0005931 A1* | 1/2016 | Lee | H01L 33/486 257/98 |
| 2016/0013375 A1 | 1/2016 | Miyazaki | |
| 2016/0020369 A1* | 1/2016 | Ukawa | H01L 33/54 29/841 |
| 2016/0109096 A1* | 4/2016 | Park | G02B 5/001 362/84 |
| 2016/0155775 A1* | 6/2016 | Yano | H01L 33/56 257/89 |
| 2016/0240746 A1* | 8/2016 | Yun | H01L 33/56 |
| 2017/0040499 A1* | 2/2017 | Ushiyama | H01L 33/502 |
| 2017/0084802 A1* | 3/2017 | Chiu | H01L 33/58 |
| 2017/0084803 A1* | 3/2017 | Iwaki | H01L 27/0248 |
| 2017/0222104 A1* | 8/2017 | Shimada | H01L 33/56 |
| 2018/0006202 A1* | 1/2018 | Kim | H01L 33/486 |
| 2018/0033934 A1* | 2/2018 | Matsuda | H01L 33/486 |
| 2018/0097161 A1* | 4/2018 | Sano | H01L 33/58 |
| 2018/0151785 A1 | 5/2018 | Hashimoto | |
| 2018/0164484 A1* | 6/2018 | Tanaka | G02B 6/009 |
| 2019/0035986 A1* | 1/2019 | Maeda | H01L 33/54 |
| 2019/0067527 A1* | 2/2019 | Toyama | H01L 33/62 |
| 2019/0123213 A1* | 4/2019 | Yu | H01L 31/0203 |
| 2019/0154236 A1* | 5/2019 | Ozeki | F21V 9/32 |
| 2019/0237634 A1* | 8/2019 | Nakabayashi | H01L 33/60 |
| 2019/0237639 A1* | 8/2019 | Kashihara | H01L 33/54 |
| 2020/0194639 A1* | 6/2020 | Hashimoto | H01L 33/58 |
| 2020/0220051 A1* | 7/2020 | Kim | H01L 33/486 |
| 2020/0287101 A1* | 9/2020 | Xu | H01L 33/58 |
| 2020/0343406 A1 | 10/2020 | Watanabe et al. | |
| 2021/0096292 A1* | 4/2021 | Nakabayashi | G02B 6/0021 |
| 2021/0313493 A1* | 10/2021 | Yeh | H01L 33/46 |
| 2021/0320231 A1* | 10/2021 | Kim | H01L 25/167 |
| 2022/0045247 A1* | 2/2022 | Wang | H01L 33/44 |
| 2022/0123180 A1* | 4/2022 | Maeda | H01L 33/505 |
| 2022/0278173 A1* | 9/2022 | Kong | H10K 59/351 |
| 2022/0412534 A1* | 12/2022 | Jin | F21V 5/007 |
| 2022/0416133 A1* | 12/2022 | Betthausen | H01L 33/52 |

FOREIGN PATENT DOCUMENTS

| | | |
|---|---|---|
| JP | 2016-018912 A | 2/2016 |
| JP | 2016-119402 A | 6/2016 |
| JP | 2017-228657 A | 12/2017 |
| JP | 2018-006472 A | 1/2018 |
| JP | 2018-092989 A | 6/2018 |
| JP | 2019029478 A | 2/2019 |
| JP | 2019212931 A | 12/2019 |
| JP | 2020-057662 A | 4/2020 |
| JP | 2020184557 A | 11/2020 |

\* cited by examiner

LIGHT EMITTING DEVICE

CROSS-REFERENCE TO RELATED APPLICATIONS

This application claims priority to Japanese Patent Application No. 2021-060143 filed on Mar. 31, 2021, the disclosure of which is hereby incorporated herein by reference in its entirety.

BACKGROUND

The present disclosure relates to a light emitting device and a method of manufacturing the same.

Japanese Patent Publication No. 2013-012545 discloses a transparent adhesive providing adhesion between a light emitting element and a phosphor plate, in which the transparent adhesive has an arc shape at a portion from a corner of a mounting surface of the light emitting element toward the phosphor plate to improve light extraction efficiency of light emitting devices.

SUMMARY

There is a demand for further improvement in the light extraction efficiency of light emitting devices. One object of certain embodiments of the present disclosure is to provide a light emitting device in which light from light emitting elements can be efficiently extracted, and a method of manufacturing the same.

A method of manufacturing a light emitting device according to one embodiment of the present disclosure includes: providing an intermediate structure including at least one light emitting element having an upper surface extending in a first direction and a second direction perpendicular to the first direction, the first direction being a longitudinal direction, the second direction being a transverse direction, and a support body on which the at least one light emitting element is disposed; securing a plate-shaped intermediate resin member and the at least one light emitting element with a light-transmissive member such that the intermediate resin member is disposed over the at least one light emitting element and includes first resin extended portions extending outwardly in the first direction respectively from both short sides of the at least one light emitting element in a plan view; cutting the intermediate resin member at cutting positions along the second direction to obtain at least one resin member with a concave lower surface, the cutting positions respectively overlapping spaces between the first resin extended portions and the support body in the plan view, a maximum distance from the at least one light emitting element to a respective one of the cutting positions in the first direction being longer than a maximum length of the at least one light emitting element in the second direction; and forming a covering member to cover lateral surfaces of the at least one resin member such that an upper surface of the at least one resin member is exposed from the covering member.

A light emitting device according to one embodiment of the present disclosure includes a support body, a light emitting element, a light-transmissive member, a resin member and a covering member. The light emitting element is disposed on the support body. The light emitting element has an upper surface extending in a first direction and a second direction perpendicular to the first direction, the first direction being a longitudinal direction, and the second direction being a transverse direction. The light-transmissive member covers lateral surfaces of the light emitting element. The resin member covers the upper surface of the light emitting element and an upper surface of the light-transmissive member, the resin member having a concave lower surface. The covering member covers lateral surfaces of the resin member with an upper surface of the resin member being exposed from the covering member. A maximum length of each of portions of the resin member disposed outward of the light emitting element in the first direction is greater than a maximum length of the light emitting element in the second direction in a plan view.

Certain embodiments of the present invention allow for providing a light emitting device in which light from light emitting elements can be efficiently extracted, and a method of manufacturing the same.

DETAILED DESCRIPTION

Figure 1:
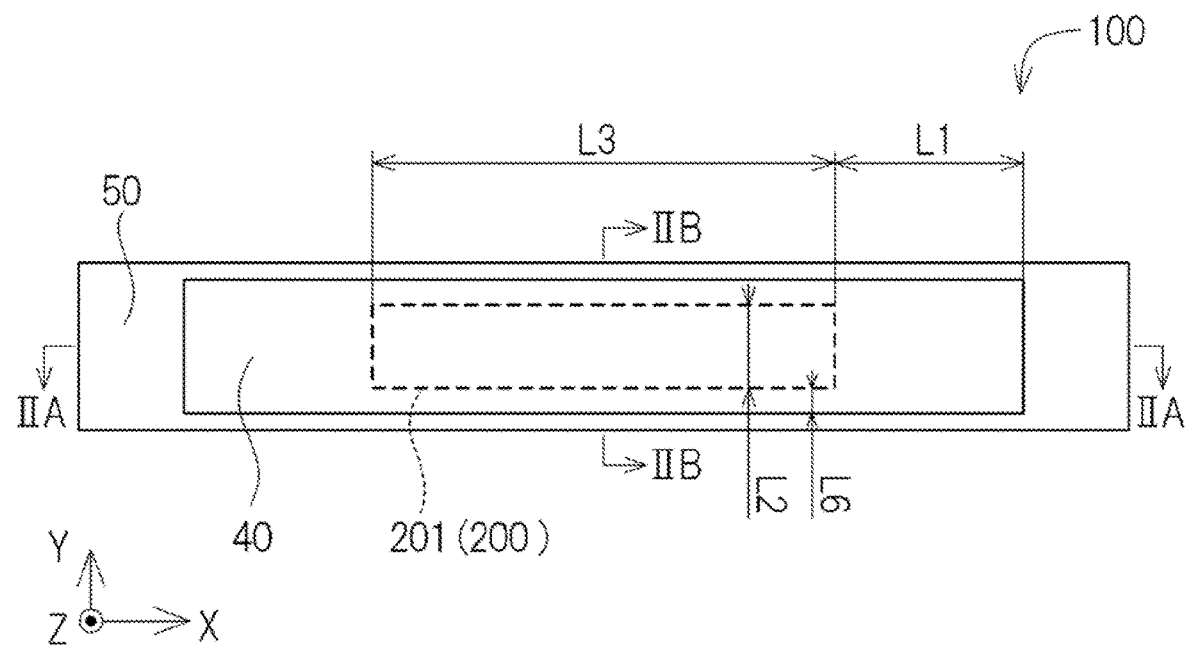
FIG. 1 is a schematic plan view of a light emitting device according to an embodiment of the present disclosure.

One embodiment of the present disclosure will be described below with reference to the drawings. Each of the drawings schematically illustrates the embodiment, so that scales, intervals, or positional relationships of members may be exaggerated, illustrations of some members may be omitted, or end views that show only cut surfaces, may be used as sectional views. Throughout the drawings, the same reference numerals represent same or similar structures. Members such as a support body, a light-transmissive member, a covering member, and a resin member will be denoted with the respective same names regardless of whether or not they have been molded, solidified, cured, or singulated.

In the following description, elements having essentially the same functionality may be denoted with the respective same reference numerals, and descriptions thereof may be omitted. Additionally, particular directional or positional terms (e.g., "on," "above," "below," or any other term including any of such terms) may be used. However, these terms are merely used for convenience in describing relative directions or positions in the drawings referred to herein. As long as the relative directions or positions, as indicated by terms such as "on," "above," and "below," are the same as those in the drawings referred to herein, arrangements of the elements in drawings other than those provided in the present disclosure, in actual products, or the like may differ from the arrangements illustrated in the drawings referred to herein. Unless otherwise specifically stated, the term "parallel" as used herein includes not only a configuration in which two straight lines, sides, surfaces, or other objects or extensions thereof do not cross each other, but also a configuration in which two straight lines, sides, surfaces, or other objects form an angle of 5 degrees or less. In the present specification, a positional relationship expressed as being "on" includes a relationship of either being directly in contact with or being in contact via an intervening element or member.

Embodiment

A light emitting device 100 according to an embodiment of the present disclosure will be described with reference to FIGS. 1 to 3E. For reference purposes, arrows indicating X, Y, and Z directions perpendicular to each other are shown in FIGS. 1 to 3E.

The light emitting device 100 includes a support body 10, at least one light emitting element 20, a light-transmissive member 30, a resin member 40, and a covering member 50. The light emitting element 20 is disposed on the support body 10. The light emitting element 20 has an upper surface 201 extending in a first direction, which is a longitudinal direction, and a second direction, which is a transverse direction, perpendicular to the first direction. The light-transmissive member 30 covers lateral surfaces 203 of the light emitting element 20. The resin member 40 covers the upper surface of the light emitting element 20 and an upper surface of the light-transmissive member 30. The resin member 40 has a concave lower surface 402. A maximum length L1 of portions of the resin member 40 outward of the light emitting element 20 in the first direction is greater than a maximum length L2 of the light emitting element 20 in the second direction. The covering member 50 covers lateral surfaces 403 of the resin member 40 with an upper surface 401 of the resin member 40 exposed. In FIG. 1, the first direction corresponds to the X direction, and the second direction corresponds to the Y direction. As used herein and depicted in the drawings, the first direction includes both +X direction and −X direction, and the second direction includes both +Y direction and −Y direction.

Figure 2A:
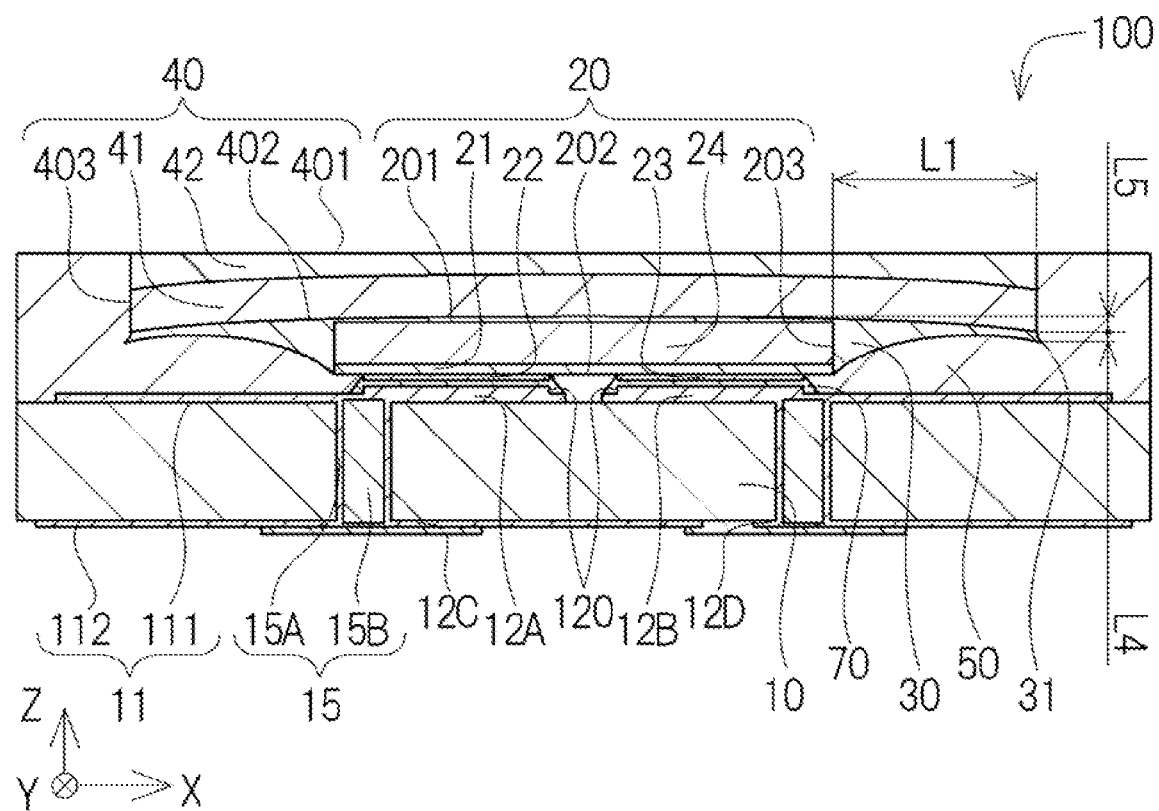
FIG. 2A is a schematic cross-sectional view of the light emitting device taken along a line IIA-IIA in FIG. 1.

As shown in FIG. 2A, with such a concave shape, the area of the lower surface 402 of the resin member 40 can be increased compared to a flat shape. This facilitates extraction of light from the light emitting element 20 to the resin member 40. This facilitates extraction of light from the light emitting element 20 to the resin member 40, which facilitates extraction of light from the light emitting element 20 to the outside of the light emitting device 100 through the resin member 40, improving the light extraction efficiency of the light emitting device 100. Further, with the maximum length L1 of the portions of the resin member 40 outward of the light emitting element 20 in the first direction (X direction) longer than the maximum length L2 of the light emitting element 20 in the second direction (Y direction), the area of the resin member 40 in a plan view can be increased as compared to when the maximum length L1 is shorter than the maximum length L2 of the light emitting element 20 in the second direction (Y direction). This facilitates extraction of light from the light emitting element 20 to the resin member 40, which allows for improving the light extraction efficiency of the light emitting device 100.

Components of the light emitting device 100 will be described below.

Support Body 10

The support body 10 is a member on which the light emitting element 20 is to be placed. The support body 10 may employ various configurations. The support body 10 may include a base member 11, a first wiring 12A, a second wiring 12B, a third wiring 12C, a fourth wiring 12D, at least one fifth wiring 12E, and vias 15.

The base member 11 may be made of an insulating material such as resin. Examples of materials for the base member 11 include epoxy, glass epoxy, bismaleimide triazine (BT), and polyimide. As in the light emitting element 20, it is preferable that an upper surface 111 of the base member 11 extends both in the first direction (X direction) being the longitudinal direction and in the second direction (Y direction) being the transverse direction perpendicular to the first direction. In other words, the upper surface 111 of the base member 11 preferably has a maximum length in the first direction (X direction) longer than a maximum length thereof in the second direction (Y direction). With the arrangement described above, the base member 11 and the light emitting element 20 can have similar sizes in a plan view, such that a reduction in size of the light emitting device 100 in a plan view can be facilitated.

Figure 2B:
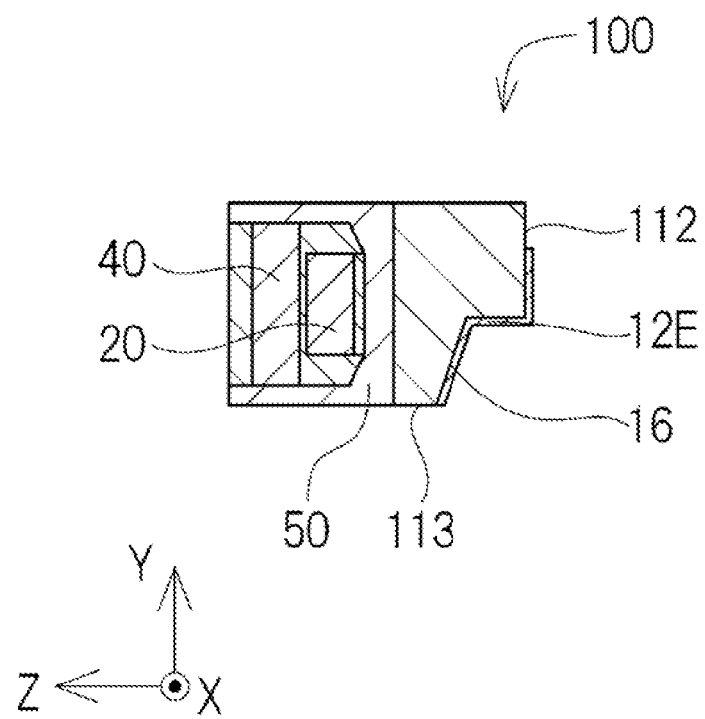
FIG. 2B is a schematic cross-sectional view of the light emitting device taken along a line IIB-IIB in FIG. 1.
Figure 2C:
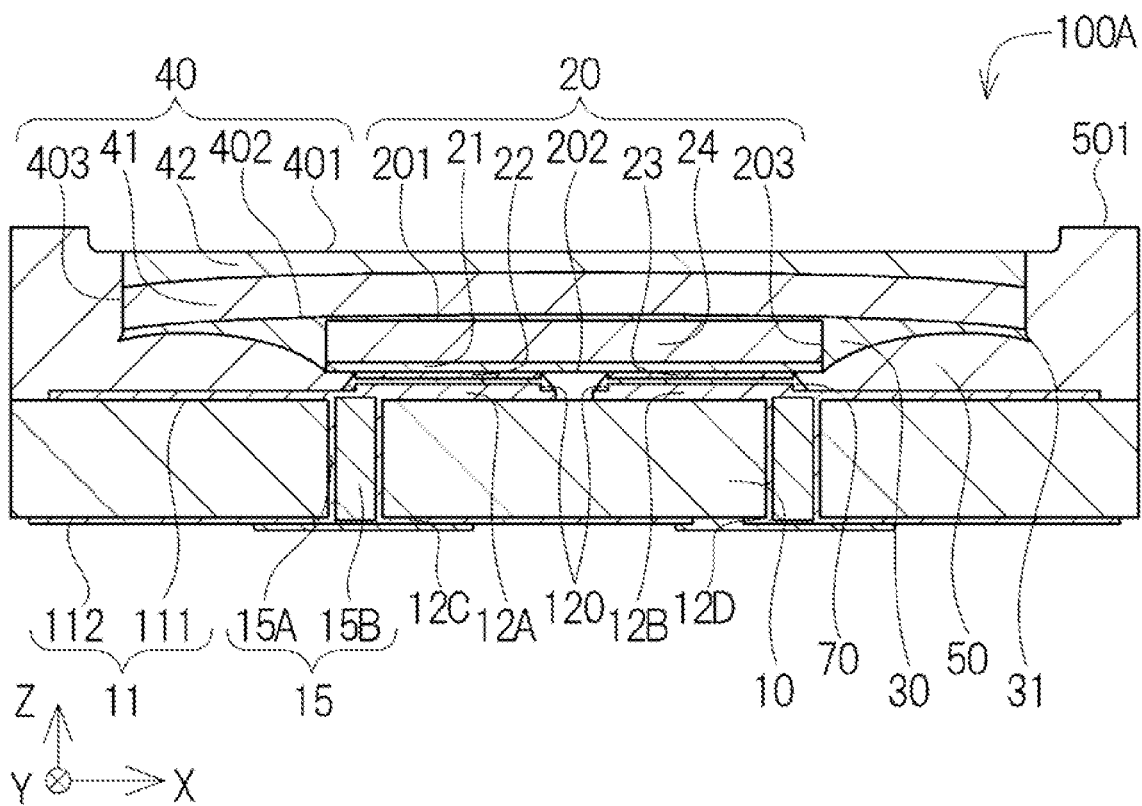
FIG. 2C is a schematic cross-sectional view of a modification of the light emitting device according to the embodiment.

As shown in FIG. 2B, the base member 11 may include inner walls defining at least one recess 16 that is open to a lower surface 112 and a lateral surface 113. The inner walls defining each recess 16 are covered by a fifth wiring 12E. A conductive bonding member such as a solder to secure the light emitting device 100 and a mounting substrate may be disposed in the recess 16. This arrangement allows for an increase in the volume of the conductive bonding member, which can improve the bonding strength between the light emitting device 100 and the mounting substrate. Either one or a plurality of the recesses 16 may be formed in the base member 11. Providing a plurality of recesses 16 can facilitate further improvement in the bonding strength between the light emitting device 100 and the mounting substrate. Regardless of whether the light emitting device 100 is of a top view type, which is configured to be mounted to the mounting substrate with the lower surface 112 of the base member 11 facing the mounting substrate, or of a side view type, which is configured to be mounted to the mounting substrate with the lateral surface 113 of the base member 11 facing the mounting substrate, the conductive bonding member can be disposed in the at least one recess 16. Thus, the bonding strength between the light emitting device 100 and the mounting substrate can be improved. In particular, when the light emitting device 100 is of a side view type, defining the recess 16 allows for improving the bonding strength between the light emitting device 100 and the mounting substrate. The fifth wiring 12E may or may not be electrically connected to corresponding ones of the first wiring 12A, the second wiring 12B, the third wiring 12C, the fourth wiring 12D and/or the via 15. It is preferable that the fifth wiring 12E is electrically connected to corresponding ones of the first wiring 12A, the second wiring 12B, the third wiring 12C, the fourth wiring 12D and the via 15. This facilitates the transfer of heat from the light emitting element 20 to the mounting substrate.

The first wiring 12A and the second wiring 12B are disposed on the upper surface 111 of the base member 11. The first wiring 12A and the second wiring 12B are preferably arranged in the first direction (X direction). This facilitates a reduction in the size of the light emitting device 100 in the second direction (Y direction). In the present specification, the expression "the first wiring 12A and the second wiring 12B are arranged in the first direction (X direction)" means that at least a portion of the first wiring 12A and at least a portion of the second wiring 12B are disposed on a straight line along the first direction (X direction). It is preferable that the first wiring 12A and the second wiring 12B do not overlap each other in the second direction. Such arrangement facilitates reducing the size of the light emitting device 100 in the second direction. The third wiring 12C and the fourth wiring 12D are disposed on the lower surface 112 of the base member 11. The third wiring 12C and the fourth wiring 12D are preferably arranged in the first direction. It is preferable that the third wiring 12C and the fourth wiring 12D do not overlap each other in the second direction. Such arrangement facilitates reducing the size of the light emitting device 100 in the second direction. The first wiring 12A, the second wiring 12B, the third wiring 12C, the fourth wiring 12D, and the fifth wiring 12E may be made of a conductive material such as copper, iron, nickel, tungsten, chromium, aluminum, silver, gold, titanium, palladium, rhodium, or an alloy of two or more of these metals. Each of the first wiring 12A, the second wiring 12B, the third wiring 12C, the fourth wiring 12D, and the fifth wiring 12E may have a single-layered or multi-layered structure. In terms of heat dissipation, it is preferred that the first wiring 12A, the second wiring 12B, the third wiring 12C, the fourth wiring 12D, and the fifth wiring 12E be made of copper or a copper alloy. In terms of characteristics such as wettability and light reflectivity of the conductive bonding member, the first wiring 12A, the second wiring 12B, the third wiring 12C, the fourth wiring 12D, and the fifth wiring 12E may be provided with a surface layer made of, for example, silver, platinum, aluminum, rhodium, gold, or an alloy of two or more of these metals.

One of the vias 15 electrically connects the first wiring 12A and the third wiring 12C. Each of the vias 15 may be formed by filling a conductive material into a corresponding through-hole in the base member 11, or may include, as shown in FIG. 2A, a conductive member 15A covering an inner surface of a corresponding through-hole in the base member 11 and a filling member 15B filled into a space enclosed by the conductive member 15A. The conductive member 15A may be made of a material similar to that of the first wiring 12A, the second wiring 12B, the third wiring 12C, the fourth wiring 12D, and the fifth wiring 12E. The filling member 15B may be conductive or insulative. The filling member 15B is preferably made of a resin material. In general, uncured resin materials have higher fluidity than that of uncured metal materials and are thus easy to fill into the through-hole in the base member 11. Thus, using a resin material for the filling member 15B facilitates the production of the support body 10. Examples of resin materials that are easy to fill include epoxy resin. When using a resin material for the filling member 15B, the resin material preferably contains an additive to reduce the coefficient of linear expansion of the filling member 15B. Containing such an additive allows for reducing a difference in the coefficients of linear expansion between the conductive member 15A and the filling member 15B, which can reduce the generation of gaps between the conductive member 15A and the filling member 15B that might otherwise be caused by heat from the light emitting element 20. Examples of the additive include silicon oxide. Alternatively, using a metal material for the filling member 15B can improve the heat dissipation. When the via 15 is formed by filling a conductive material into the through-hole in the base member 11, it is preferred to use a metal material with high heat conductivity, such as Ag and Cu. The support body 10 may further include a via that electrically connects the second wiring 12B and the fourth wiring 12D.

As shown in FIG. 2A, when the light emitting element 20 is flip-chip mounted on the support body 10, it is preferred that the first wiring 12A include a protrusion 120 at a position that overlaps a positive electrode 22 of the light emitting element 20 in a plan view. With the first wiring 12A having the protrusion 120, during an operation of connecting the first wiring 12A to the positive electrode 22 of the light emitting element 20 via a conductive bonding member 70, alignment between the light emitting element 20 and the support body 10 can be facilitated due to a self-alignment effect. Likewise, it is preferred that the second wiring 12B include a protrusion 120 at a position that overlaps a negative electrode 23 of the light emitting element 20 in a plan view.

Light Emitting Element 20

The light emitting element 20 is a semiconductor element that emits light upon application thereto of a voltage.

A known semiconductor element made of a nitride semiconductor or the like may be used for the light emitting element 20. Examples of the light emitting element 20 include an LED chip. The light emitting element 20 includes a semiconductor layered structure 21. The semiconductor layered structure 21 includes an n-type semiconductor layer, a p-type semiconductor layer, and a light emitting layer sandwiched between these layers. The light emitting layer may have a structure such as a double heterojunction structure or a single quantum well (SQW) structure, or may have a structure with a group of active layers such as a multiple quantum well (MQW) structure. The semiconductor layered structure 21 is configured to emit visible light or ultraviolet light. The semiconductor laminate 21 including such a light emitting layer may contain, for example, $In_xAl_yGa_{1-x-y}N$ ($0 \leq x$, $0 \leq y$, $x+y \leq 1$).

The semiconductor layered structure 21 may have a structure having one or more light emitting layers between an n-type semiconductor layer and a p-type semiconductor layer, or may have repeating structures each including an n-type semiconductor layer, a light emitting layer, and a p-type semiconductor layer in this order. When the semiconductor layered structure 21 includes a plurality of light emitting layers, the plurality of light emitting layers may include light emitting layers with different peak emission wavelengths, or may include light emitting layers with the same peak emission wavelengths. The term "same peak emission wavelengths" may encompass wavelengths with a variation of not more than ±10 nm. The combination of peak emission wavelengths of the plurality of light emitting layers may be chosen as appropriate. For example, when the semiconductor layered structure 21 includes two light emitting layers, light emitting layers can be selected to provide a combination of emission colors such as blue light and blue light, green light and green light, red light and red light, ultraviolet light and ultraviolet light, blue light and green light, blue light and red light, or green light and red light. Each light emitting layer may include a plurality of active layers with different peak emission wavelengths or a plurality of active layers with the same peak emission wavelengths.

A single light emitting element 20 may be disposed in a single light emitting device, or a plurality of light emitting elements 20 may be disposed in a single light emitting device. When a plurality of light emitting elements 20 are disposed in a single light emitting device, light emitting elements 20 with the same peak emission wavelengths may be combined in order to improve the light intensity. Alternatively, a plurality of light emitting elements 20 with different peak emission wavelengths may be combined to correspond to, for example, red, green, and blue to improve the color reproducibility. When the light emitting device 100 includes a plurality of light emitting elements 20, all of the plurality of light emitting elements 20 may be connected in series or in parallel, or serial and parallel connections may be combined.

The light emitting element 20 has an upper surface extending in the first direction (X direction) being the longitudinal direction and in the second direction (Y direction) being the transverse direction perpendicular to the first direction. In other words, a maximum length L3 of the upper surface 201 of the light emitting element 20 in the first direction (X direction) is longer than the maximum length L2 thereof in the second direction (Y direction). The light emitting element 20 is disposed on the support body 10. It is preferred that the positive electrode 22 and the negative electrode 23 of the light emitting element 20 be formed on the same surface side of the light emitting element 20 and that the light emitting element 20 be flip-chip mounted on the support body 10. This can eliminate the need for wires for supplying electricity to the positive and negative electrodes 22, 23 of the light emitting element 20, facilitating a reduction in the size of the light emitting device.

The light emitting element 20 may or may not include an element substrate 24. The element substrate 24 of the light emitting element 20 may be a crystal growth substrate on which semiconductor crystals constituting the semiconductor layered structure 21 can be grown. Alternatively, the element substrate 24 may be a support substrate bonded to a semiconductor layered structure separated from a crystal growth substrate. Examples of a base material of the element substrate 24 include sapphire, gallium nitride, and aluminum nitride.

Light-Transmissive Member 30

The light-transmissive member 30 covers the lateral surfaces 203 of the light emitting element 20 and transmits light. The light-transmissive member 30 may cover at least a portion of the lateral surfaces 203 of the light emitting element 20. The light-transmissive member 30 may cover the entire lateral surfaces 203 of the light emitting element 20. With the lateral surfaces 203 of the light emitting element 20 covered with the light-transmissive member 30, the light emitting element 20 can be protected from external stresses. The light-transmissive member 30 has a higher transmittance with respect to the peak wavelength of the light emitting element 20 than that of the covering member 50. Thus, with the light-transmissive member 30 covering the lateral surfaces 203 of the light emitting element 20, light emitted from the lateral surfaces 203 of the light emitting element 20 can be facilitated to be extracted to the outside of the light emitting device 100 through the light-transmissive member 30. The term "light-transmissive" or "transmits light" as used in the present specification refers to having a transmittance of 50% or more at the peak wavelength of the light emitting element 20. When the light emitting device includes a plurality of light emitting elements 20, the light-transmissive member 30 may have a transmittance of 50% or greater at the peak wavelength of at least one of the light emitting elements 20. It is preferred that the light-transmissive member 30 be spaced apart from the support body 10. Such an arrangement allows for reducing or preventing the light emitted from the light emitting element 20 from being absorbed by the support body 10.

As shown in FIG. 2A, preferably, the light-transmissive member 30 is in contact with the upper surface 201 of the light emitting element 20 and the lower surface 402 of the resin member 40. This structure allows for facilitating improvement in the bonding strength between the light emitting element 20 and the resin member 40. The light-transmissive member 30 preferably covers the entirety of the upper surface 201 of the light emitting element 20. This structure allows for facilitating improvement in the bonding strength between the light-transmissive member 30 and the light emitting element 20. The light-transmissive member 30 preferably covers the entire lower surface 402 of the resin member 40. This allows for facilitating improvement in the bonding strength between the light-transmissive member 30 and the resin member 40. Covering the entire lower surface 402 of the resin member 40 with the light-transmissive member 30 also allows light emitted from the light emitting element 20 to be facilitated to be extracted to the resin member 40 through the light-transmissive member 30.

As shown in FIG. 2A, the light-transmissive member 30 preferably includes at least one light-transmissive extended portion 31 located outward of the resin member 40. This allows for facilitating an increase in the contact area between the light-transmissive member 30 and the covering member 50. Accordingly, the light-transmissive member 30 and the covering member 50 can be prevented from being separated from each other. The light-transmissive extended portion 31 is preferably located below a plane including the upper surface 201 of the light emitting element 20. This arrangement allows the light emitted from the upper surface 201 of the light emitting element 20 to be less easily incident on the light-transmissive extended portion 31, which allows for reducing or preventing degradation of the light-transmissive extended portion 31 that might otherwise be caused by the light emitted from the light emitting element 20. Accordingly, separation of the light-transmissive member 30 and the covering member 50 from each other can be reduced or prevented.

With the maximum length L1 of the portions of the resin member 40 outward of the light emitting element 20 in the first direction longer than the maximum length L2 of the light emitting element 20 in the second direction, a maximum length between the light emitting element 20 and the light-transmissive extended portion 31 in the first direction can be increased. Accordingly, light emitted from the upper surface 201 of the light emitting element 20 is less easily incident on the light-transmissive extended portion 31, which allows for reducing or preventing degradation of the light-transmissive extended portion 31 that might otherwise be caused by the light emitted from the light emitting element 20.

In a cross-sectional view, it is preferred that the covering member 50 be located on a straight line connecting the light emitting element 20 and the light-transmissive extended portion 31. This arrangement allows for reducing or preventing the light emitted from the light emitting element 20 from being incident on the light-transmissive extended portion 31. Accordingly, degradation of the light-transmissive extended portion 31 that might otherwise be caused by the light emitted from the light emitting element 20 can be suppressed. In a cross-sectional view, the covering member 50 may be located on one of a plurality of straight lines connecting the light emitting element 20 and the light-transmissive extended portion 31.

The light-transmissive extended portion 31 is preferably located above a plane including the lower surface 202 of the light emitting element 20. With this arrangement, contact between the light-transmissive extended portion 31 and the support body 10 can be prevented. Thus, the light emitted from the light emitting element 20 can be prevented or reduced from being absorbed by the support body 10.

As shown in FIG. 2A, in a cross-sectional view, it is preferred that a portion of the light-transmissive member 30 at an end of the resin member 40 has a maximum thickness L4 be in a range of 0.01 times to 0.1 times the maximum length L1 of portions of the resin member 40 outward of the light emitting element 20 in the first direction. When a portion of the light-transmissive member 30 at the end of the resin member 40 has the maximum thickness L4 equal to or greater than 0.01 times the maximum length L1 of portions of the resin member 40 outward of the light emitting element 20 in the first direction, the maximum thickness L4 of the portion of the light-transmissive member 30 at the end of the resin member 40 is increased to facilitate extraction of light from the light emitting element 20 to the outside of the light emitting device 100 through the light-transmissive member 30. Also, when the maximum thickness L4 of a portion of the light-transmissive member 30 at the end of the resin member 40 is equal to or smaller than 0.1 times the maximum length L1 of portions of the resin member 40 outward of the light emitting element 20 in the first direction, the light-transmissive member 30 can be prevented from contacting the support body 10. With this structure, the light emitted from the light emitting element 20 can be prevented or reduced from being absorbed by the support body 10. The "maximum thickness" as used in the present specification refers to a maximum length in the third direction (Z direction) perpendicular to the first direction (X direction) and the second direction (Y direction).

Examples of a base material of the light-transmissive member 30 include silicone resins, epoxy resins, phenol resins, polycarbonate resins, acrylic resins, and modified resins thereof. Among these, silicone resins and modified silicone resins have high heat resistance and light resistance, and thus are preferred. The light-transmissive member 30 may further contain a filler and/or a phosphor. Examples of the filler include titanium oxide, zirconium oxide, aluminum oxide, and silicon oxide.

Known materials can be employed for the phosphor. Examples of the phosphor include yttrium-aluminum-garnet-based phosphors (e.g., $Y_3(Al,Ga)_5O_{12}$:Ce), lutetium-aluminum-garnet-based phosphors (e.g., $Lu_3(Al,Ga)_5O_{12}$:Ce), terbium-aluminum-garnet-based phosphors (e.g., $Tb_3(Al,Ga)_5O_{12}$:Ce), CCA-based phosphors (e.g., $Ca_{10}(PO_4)_6Cl_2$:Eu), SAE-based phosphors (e.g., $Sr_4Al_{14}O_{25}$:Eu), chlorosilicate-based phosphors (e.g., $CasMgSi_4O_{16}Cl_2$:Eu), nitride-based phosphors, fluoride-based phosphors, phosphors with perovskite structure (e.g., $CsPb(F,Cl,Br,I)_3$), and quantum dot phosphors (e.g., CdSe, InP, $AgInS_2$, or $AgInSe_2$).

Examples of the nitride-based phosphors include β-SiAlON-based phosphors (e.g., $(Si,Al)_3(O,N)_4$:Eu), α-SiAlON-based phosphors (e.g., $Ca(Si,Al)_{12}(O,N)_{16}$:Eu), SLA-based phosphors (e.g., $SrLiAl_3N_4$:Eu), CASN-based phosphors (e.g., $CaAlSiN_3$:Eu), and SCASN-based phosphors (e.g., $(Sr,Ca)AlSiN_3$:Eu).

Examples of the fluoride-based phosphors include KSF-based phosphors (e.g., $K_2SiF_6$:Mn), KSAF-based phosphors (e.g., $K_2(Si,Al)F_6$:Mn), and MGF-based phosphors (e.g., $3.5MgO \cdot 0.5MgF_2 \cdot GeO_2$:Mn).

Resin Member 40

The resin member 40 covers the upper surface of the light emitting element 20 and the upper surface of the light-transmissive member 30 and transmits light. Covering the upper surface 201 of the light emitting element 20 with the resin member 40 allows for protecting the light emitting element 20 from external stresses. As shown in FIG. 2A, the lower surface 402 of the resin member 40 has a concave shape. Such a shape allows for increasing the area of the lower surface 402 of the resin member 40 as compared to when the lower surface 402 of the resin member 40 has a flat shape. Accordingly, extraction of light from the light emitting element 20 to the resin member 40 can be facilitated. As shown in FIG. 2A, it is preferred that a portion of the resin member 40 be located below a plane including the upper surface 201 of the light emitting element 20. Such an arrangement can facilitate an increase in the area of the lower surface 402 of the resin member 40. As used herein, the term "concave shape" of the lower surface 402 of the resin member 40 refers to a shape in which a height of the lower surface 402 of the resin member 40 in the third direction (Z direction) gradually reduces from near the center of the resin member 40 to an end of the resin member 40 in sectional view. The lower surface 402 of the resin member 40 may have surface irregularities of 10 μm or less. The term "center of the resin member" as used in the present specification refers to the centroid of the resin member 40 in a plan view.

The maximum length L1 of portions of the resin member 40 outward of the light emitting element 20 in the first direction (X direction) is greater than the maximum length L2 of the light emitting element 20 in the second direction (Y direction). Accordingly, the area of the resin member 40 in a plan view can be increased as compared to when the maximum distance L1 between the light emitting element 20 and a corresponding end of the resin member 40 in the first direction is shorter. Thus, extraction of light from the light emitting element 20 to the resin member 40 can be facilitated, allowing improvement in the light extraction efficiency of the light emitting device 100.

The lower surface 402 of the resin member 40 preferably extends in the first direction (X direction) being the longitudinal direction and in the second direction (Y direction) being the transverse direction perpendicular to the first direction. In other words, a maximum length of the lower surface 402 of the resin member 40 in the first direction (X direction) is preferably longer than a maximum length thereof in the second direction (Y direction). Having such a size allows for facilitating the resin member 40 and the light emitting element 20 to be similar in size in a plan view. This can facilitate reduction in the size of the light emitting device 100 in a plan view.

As shown in FIG. 2A, preferably, the lower surface 402 of the resin member 40 has a concave shape in a cross-sectional view taken along a line along the first direction (X direction). Having such a shape allows for facilitating the extraction of light from the light emitting element 20 to the resin member 40. With the upper surface 201 of the light emitting element 20 having a greater length in the first direction (X direction), having the lower surface 402 with such a concave shape in a cross-sectional view taken along a straight line along the first direction (X direction) allows for facilitating an increase in the area of the lower surface 402 of the resin member 40. In a cross-sectional view taken along a straight line along the second direction (Y direction), the lower surface 402 of the resin member 40 may have a concave shape, or may have a shape other than a concave shape as shown in FIG. 2B. Having the lower surface 402 of the resin member 40 with a concave shape in a cross-sectional view taken along a straight line along the second direction (Y direction) allows for facilitating an increase in the area of the lower surface 402 of the resin member 40.

A portion of the resin member 40 between an uppermost portion of the lower surface 402 and a lowermost portion of the lower surface 402 in the third direction (Z direction) may have a length L5 of any appropriate value, and the length L5 is preferably in a range of 20 μm to 100 μm. With the length L5 of 20 μm or greater between the uppermost portion and the lowermost portion of the lower surface 402 of the resin member 40 in the third direction (Z direction), increase in the area of the lower surface 402 of the resin member 40 can be facilitated. With the length L5 of 100 μm or greater between the uppermost portion and the lowermost portion of the lower surface 402 of the resin member 40 in the third direction (Z direction), cracks in the resin member 40 can be prevented or reduced that might otherwise occur during bending a planar intermediate resin member to form the resin member 40 as described below.

As shown in FIG. 1, a maximum length L6 of portions of the resin member 40 outward of the light emitting element 20 in the second direction (Y direction) is preferably shorter than the maximum length L2 of the light emitting element 20 in the second direction (Y direction). This allows for facilitating reduction in the size of the light emitting device 100 in the second direction (Y direction).

Examples of a base material of the resin member 40 include silicone resins, epoxy resins, phenol resins, polycarbonate resins, acrylic resins, and modified resins thereof. Among these, silicone resins and modified silicone resins have high heat resistance and light resistance, and thus are preferable. Difference in a refractive index between a base material of the light-transmissive member 30 and the resin member 40 is preferably than 0.05 or less. With such difference in a refractive index, light from the light emitting element 20 can be prevented or reduced from being reflected or refracted at an interface between the light-transmissive member 30 and the resin member 40. Accordingly, extraction of light from the light emitting element 20 to the resin member 40 can be facilitated, thus improving the light extraction efficiency of the light emitting device 100. A difference in the coefficients of linear expansion between abase material of the light-transmissive member 30 and the resin member 40 may be any appropriate value, but preferably is 30 ppm/° C. or less. This allows for reducing or preventing separation of the light-transmissive member 30 and the resin member 40 from each other. For example, when a phenyl silicone resin is used as a base material of the light-transmissive member 30, a phenyl silicone resin may be used as a base material of the resin member 40.

Similarly to the light-transmissive member 30, the resin member 40 may contain a filler and/or a phosphor. Containing a phosphor in the resin member 40 allows for facilitating color adjustment of the light emitting device 100. The resin member 40 may contain a single or a plurality of kinds of phosphors. The phosphor contained in the resin member 40 may be dispersed or unevenly distributed. It is preferred that the phosphor contained in the resin member 40 be predominantly dispersed at the light emitting element 20 side. In other words, it is preferred that a phosphor concentration in lower portions of the resin member 40 be higher than that in upper portions of the resin member 40. This allows for facilitating portions with a higher phosphor concentration to have a substantially uniform thickness, which can facilitate reducing or preventing unevenness in emission color of the light emitting device 100. For example, the phosphor can be predominantly dispersed at the light emitting element 20 side by precipitating a wavelength conversion member in the resin member 40 during a manufacturing process.

The resin member 40 may be formed of a single layer or a plurality of layers. As shown in FIG. 2A, the resin member 40 may include a phosphor-containing layer 41 and a phosphor-free layer 42. The phosphor-free layer 42 is preferably located above the phosphor-containing layer 41. In other words, preferably, an upper surface of the phosphor-containing layer 41 is covered with the phosphor-free layer 42. This allows the phosphor-free layer 42 to also serve as a protecting layer, which can reduce or prevent degradation of the phosphor due to moisture or the like. Examples of phosphors vulnerable to moisture include KSF phosphors and KSAF phosphors. The term "phosphor-free" as used in the present specification does not preclude phosphor particles that are inevitably mixed in, and may contain 0.05 wt % or less of phosphor particles. The phosphor-containing layer 41 and/or the phosphor-free layer 42 may be constituted of a single layer or a plurality of layers.

Covering Member 50

The covering member 50 covers the lateral surfaces 403 of the resin member 40 with the upper surface 401 of the covering member 50 exposed. Covering the lateral surfaces 403 of the resin member 40 with the covering member 50 allows for protecting the resin member 40 from external stresses. The covering member 50 is preferably reflective to light from the light emitting element 20. This allows for increasing contrast between emission regions and non-emission regions. In the present specification, the term "reflective" means having a reflectance of 60% or greater for the peak wavelength of the light emitting element 20. When the light emitting device includes a plurality of light emitting elements 20, the covering member 50 may have a reflectance of 60% or greater for the peak wavelength of at least one of the light emitting elements 20.

The covering member 50 preferably covers the lateral surfaces 203 of the light emitting element 20 via the light-transmissive member 30. This allows for protecting the light emitting element 20 from external stresses. The covering member 50 is preferably in contact with the lower surface 202 of the light emitting element 20. This arrangement allows for reducing or preventing separation between the covering member 50 and the light emitting element 20. When the covering member 50 has reflectivity, covering the lower surface 202 of the light emitting element 20 with the covering member 50 allows for reducing or preventing the light emitted from the light emitting element 20 from being absorbed by the support body 10. This allows for improving the light extraction efficiency of the light emitting device 100. The covering member 50 is preferably in contact with the support body 10. This arrangement allows for reducing or preventing separation between the covering member 50 and the support body 10. As shown in FIG. 2A, preferably, the covering member 50 is disposed such that the light-transmissive extended portion 31 is engaged with the covering member 50 in the third direction (Z direction). This allows for reducing or preventing separation between the covering member 50 and the light-transmissive extended portion 31.

As shown in FIG. 2A, the upper surface 401 of the resin member 40 and the upper surface of the covering member 50 may be flush with each other. This arrangement allows for facilitating reduction in the size of the light emitting device. As in a light emitting device 100A shown in FIG. 2C, the upper surface 501 of the covering member 50 may be located above (located higher than) the upper surface 401 of the resin member 40. This arrangement allows for reducing or preventing damages to the upper surface 401 of the resin member 40. As shown in FIGS. 3A to 3D, the lateral surfaces of the covering member 50 and the support body 10 are preferably flush with each other. This arrangement allows for facilitating reduction in the size of the light emitting device. In the present specification, the term "flush" may include tolerances of up to ±5 μm.

The covering member 50 may be made of a resin material containing resin, which serves as a base material, and a light-reflective material. Examples of a base material of the covering member 50 include silicone resins, epoxy resins, phenol resins, polycarbonate resins, acrylic resins, and modified resins thereof. Among these, silicone resins and modified silicone resins are preferred because they have high heat resistance and light resistance. A difference in the coefficients of linear expansion between the base material of the light-transmissive member 30 and the base material of the covering member 50 may be any appropriate value, but is preferably 30 ppm/° C. or less, which allows for reducing or preventing separation between the light-transmissive member 30 and the covering member 50. For example, when a phenyl silicone resin is used as a base material of the light-transmissive member 30, a phenyl silicone resin may be used as a base material of the covering member 50.

For a light-reflective material of the covering member 50, titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, or silicon oxide may be used singly, or two or more of these materials may be used in combination. The content of the light-reflective material in the covering member 50 may be appropriately selected, and is, for example, preferably in a range of 10 wt % to 80 wt %, more preferably in a range of 20 wt % to 70 wt %, and still more preferably in a range of 35 wt % to 65 wt %, in terms of characteristics such as light reflectivity and viscosity in a liquid phase. The term "wt %" stands for "weight percent," representing a weight ratio of a relevant material to a total weight of the covering member.

Insulating Film 60

Figure 3A:
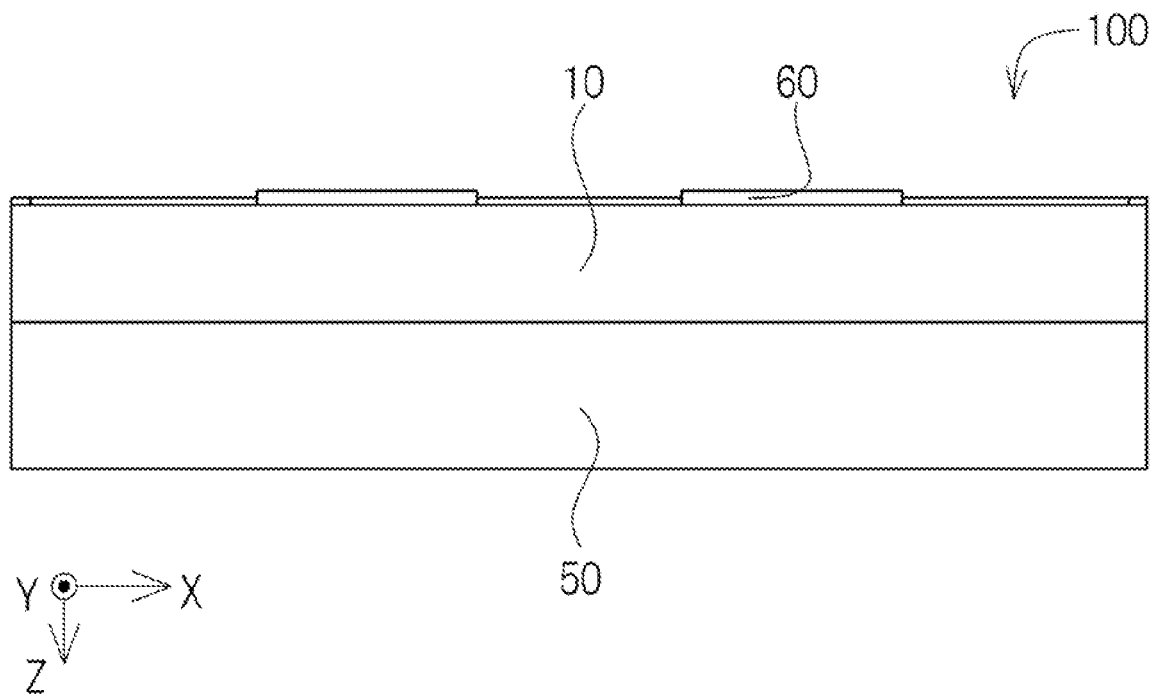
FIG. 3A is a schematic front view of the light emitting device according to the embodiment.
Figure 3B:
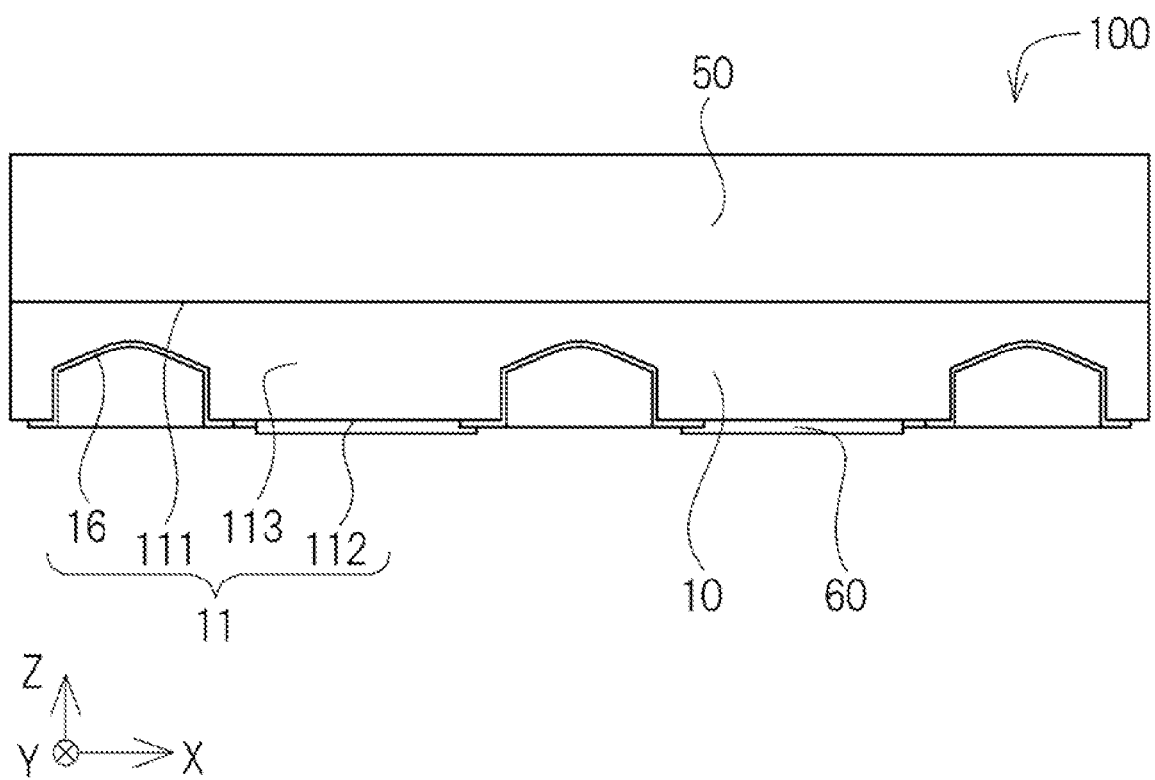
FIG. 3B is a schematic rear view of the light emitting device according to the embodiment.
Figure 3C:
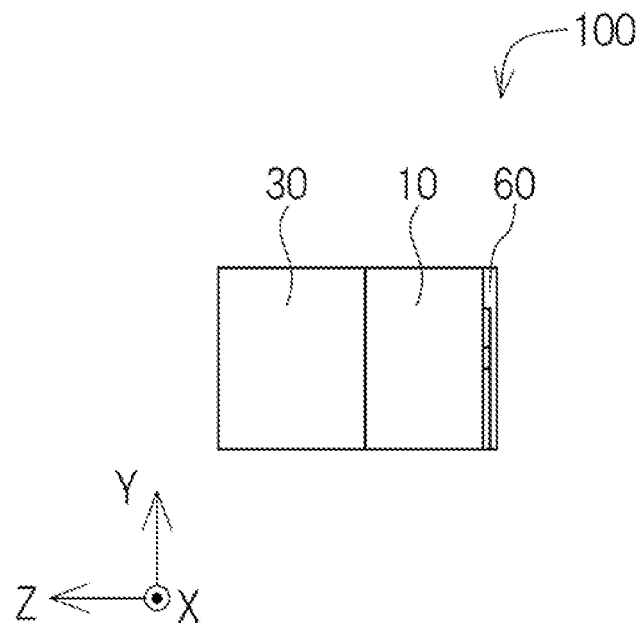
FIG. 3C is a schematic right-side view of the light emitting device according to the embodiment.
Figure 3D:
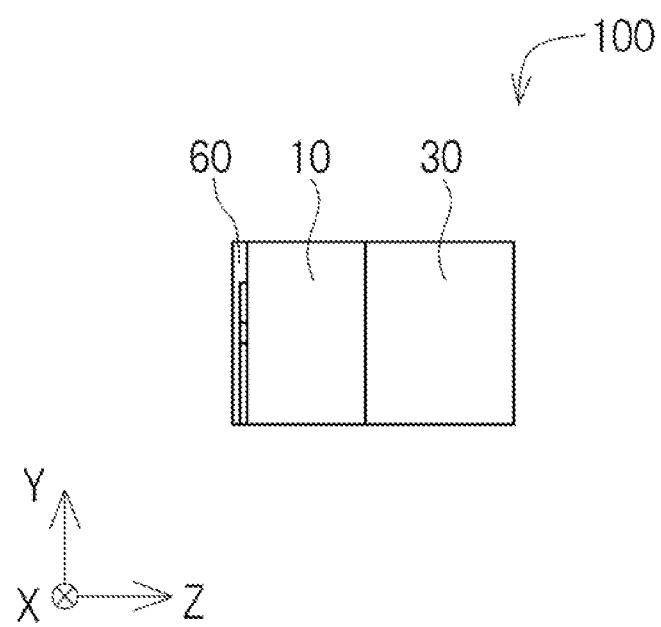
FIG. 3D is a schematic left-side view of the light emitting device according to the embodiment.
Figure 3E:
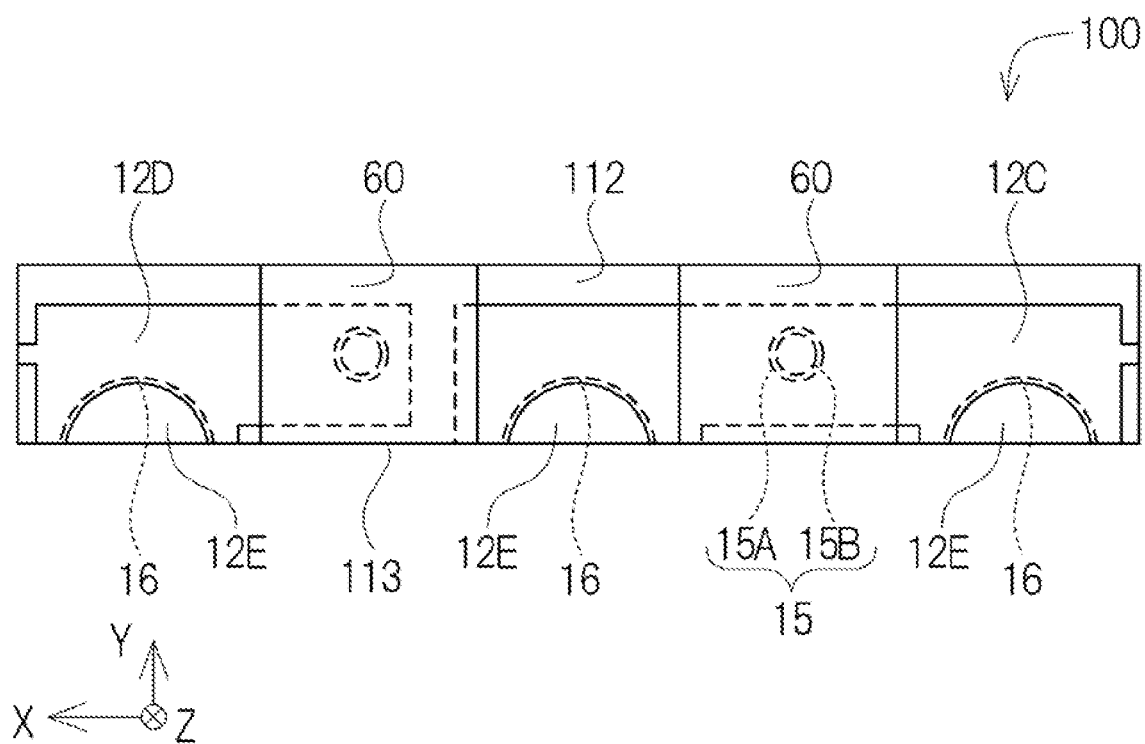
FIG. 3E is a schematic bottom view of the light emitting device according to the embodiment.

As shown in FIG. 3E, the light emitting device 100 may include at least one insulating film 60 partially covering the third wiring 12C and/or the fourth wiring 12D. With the insulating film 60, short-circuit of the third wiring 12C and the fourth wiring 12D can be prevented. The insulating film 60 also allows for reducing or preventing separation of the third wiring 12C and/or the fourth wiring 12D from the base member 11.

Referring to FIGS. 4A to 8, a method of manufacturing the light emitting device 100 will be described.

The method of manufacturing the light emitting device 100 according to the present embodiment includes:
(1) an intermediate structure provision step of providing an intermediate structure including at least one light emitting element and a support body, the at least one light emitting element having an upper surface extending in a first direction and a second direction perpendicular to the first direction, the first direction being a longitudinal direction, the second direction being a transverse direction, the support body being disposed on the at least one light emitting element;
(2) an intermediate resin member securing step of securing a plate-shaped intermediate resin member and the at least one light emitting element with a light-transmissive member such that the intermediate resin member is disposed over the at least one light emitting element in a plan view and includes first resin extended portions that corresponding to portions in a plan view extending in the first direction from both the opposite sides of respective ones of the at least one light emitting element and;
(3) a resin member obtaining step of cutting the intermediate resin member along the second direction at positions that overlap a space between the support body and the first resin extended portions such that a maximum distance between a respective one of the at least one light emitting element and a respective one of the positions in the first direction is longer than a maximum length of the respective one of the at least one light emitting element in the second direction to obtain a resin member having a concave lower surface; and
(4) a covering member forming step of forming a covering member, the covering member covering lateral surfaces of the resin member with an upper surface of the resin member exposed.

Intermediate Structure Provision Step

Figure 4A:
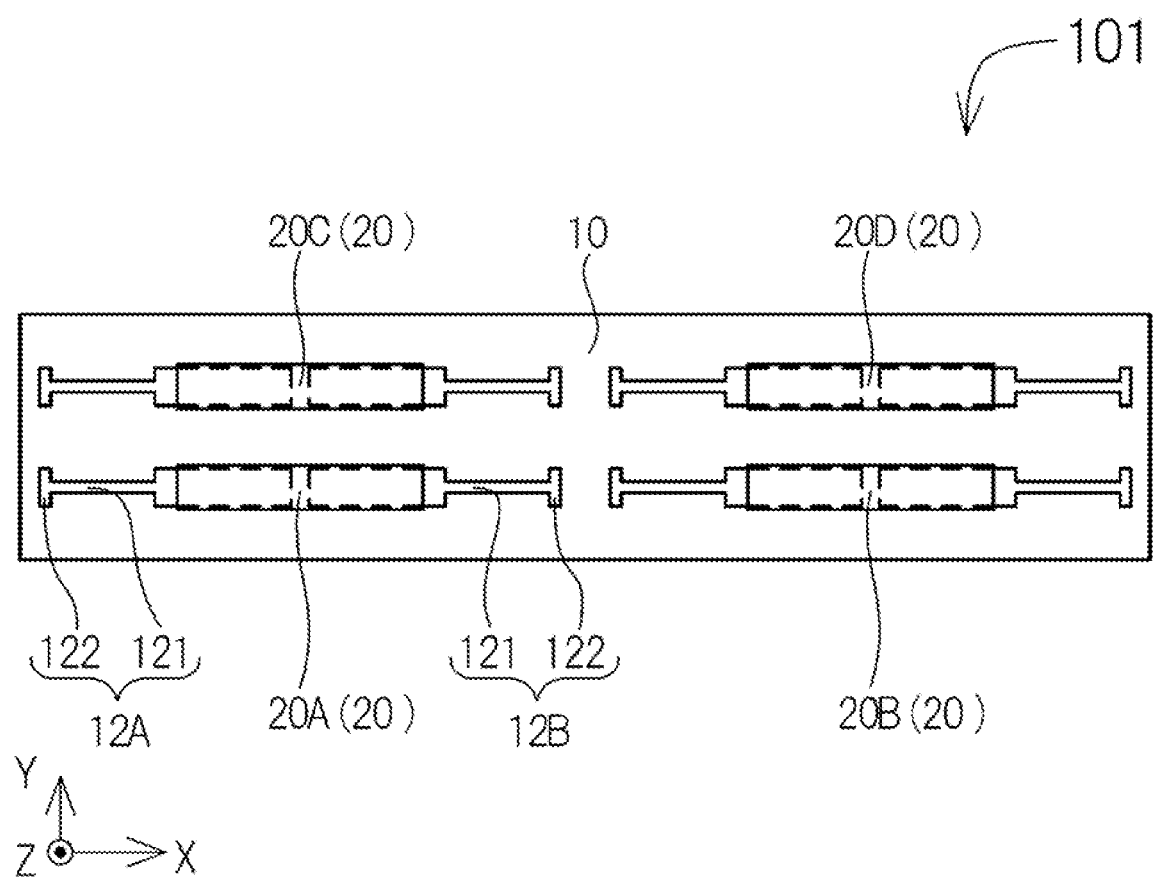
FIG. 4A is a schematic plan view showing a method of manufacturing the light emitting device according to the embodiment.
Figure 4B:
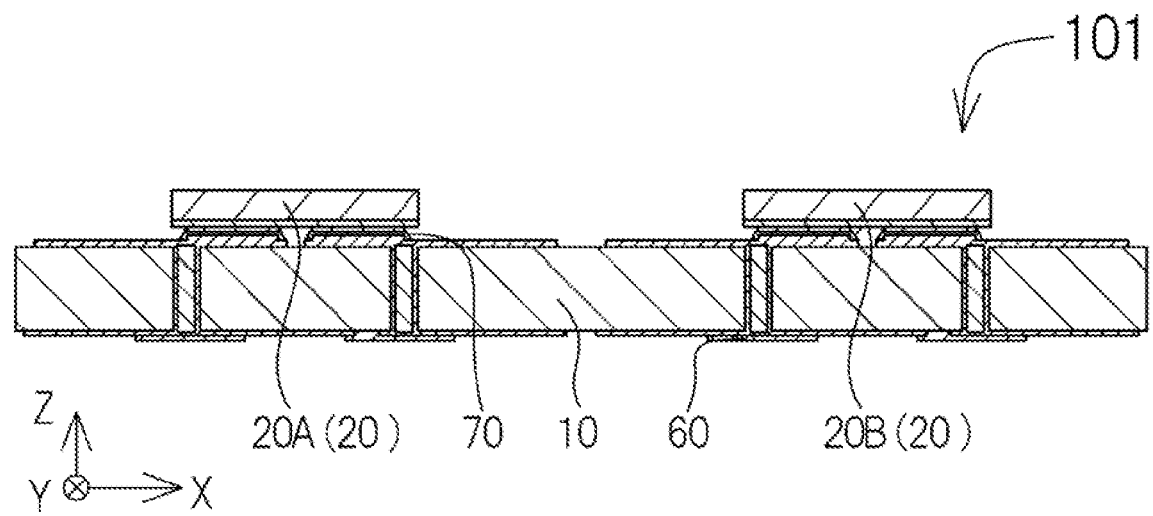
FIG. 4B is a schematic cross-sectional view showing the method of manufacturing the light emitting device according to the embodiment.

Referring to FIGS. 4A and 4B, an intermediate structure provision step will be described. An intermediate structure 101 provided in the intermediate structure provided step includes the support body 10 and at least one light emitting element 20. The support body 10 may be in a singulated form for each light emitting device, or may be in a collective form prior to singulation as shown in FIGS. 4A and 4B. In the present specification, both of a support body singulated for each light emitting device and a support body in a collective form prior to singulation will be referred to as a support body. The light emitting element 20 has an upper surface extending in the first direction being the longitudinal direction and in the second direction being the transverse direction perpendicular to the first direction. In FIG. 4A, the first direction corresponds to the X direction, and the second direction corresponds to the Y direction. When the intermediate structure 101 includes a plurality of light emitting elements 20, each of the light emitting elements 20 has an upper surface extending in the first direction being the longitudinal direction and in the second direction being the transverse direction perpendicular to the first direction. The light emitting device 20 is disposed on the support body 10. The intermediate structure 101 may be provided through the step of placing the light emitting element 20 on the support body 10, or the intermediate structure 101 may be purchased for the provision.

Two light emitting elements 20 included in the intermediate structure 101 may be referred to as a first light emitting element 20A and a second light emitting element 20B, respectively. As shown in FIGS. 4A and 4B, the first light emitting element 20A and the second light emitting element 20B are preferably arranged in the first direction (X direction) and do not overlap each other in the second direction (Y direction). This arrangement allows for facilitating an increase in the number of light emitting elements 20 that can be disposed on the support body 10. Accordingly, an increase in the number of light emitting devices that can be produced from a single intermediate structure 101 can be facilitated. As shown in FIG. 4A, the intermediate structure 101 may further include a third light emitting element 20C arranged such that the third light emitting element 20C and the first light emitting element 20A are aligned in the second direction (Y direction), and a fourth light emitting element 20D arranged such that fourth light emitting element 20D and the second light emitting element 20B are aligned in the second direction (Y direction). The third light emitting element 20C and the fourth light emitting element 20D are preferably arranged in the first direction (X direction) and do not overlap each other in the second direction (Y direction). This arrangement allows for facilitating increase in the number of light emitting elements 20 that can be disposed on the support body 10.

As shown in FIG. 4A, the first wiring 12A preferably includes a first extended portion 121 and a second extended portion 122 at positions that do not overlap a corresponding light emitting element 20 in a plan view; the first extended portion 121 extends in the first direction (X direction), and the second extended portion 122 extends in the second direction (Y direction) from the first extended portion 121. This allows the light emitting element 20 to be disposed on the first wiring 12A with respect to the first extended portion 121 and/or the second extended portion 122. This can facilitate improvement in the positional accuracy of the light emitting element 20. The first extended portion 121 and/or the second extended portion 122 can also be used for easily confirming the positional accuracy of the light emitting element 20 disposed on the support body 10. Likewise, the second wiring 12B preferably includes, at positions not overlapping the corresponding light emitting element 20 in a plan view, the first extended portion 121 extending in the first direction (X direction) and the second extended portion 122 extending in the second direction (Y direction) from the first extended portion 121.

Intermediate Resin Member Fixing Step

Figure 5A:
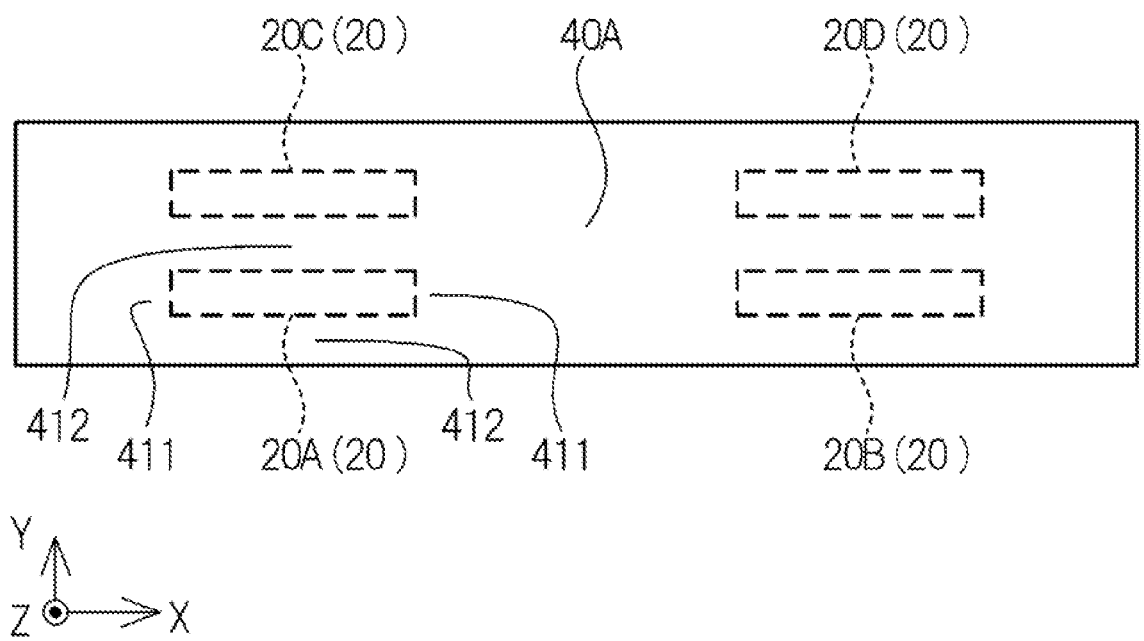
FIG. 5A is a schematic plan view showing the method of manufacturing the light emitting device according to the embodiment.
Figure 5B:
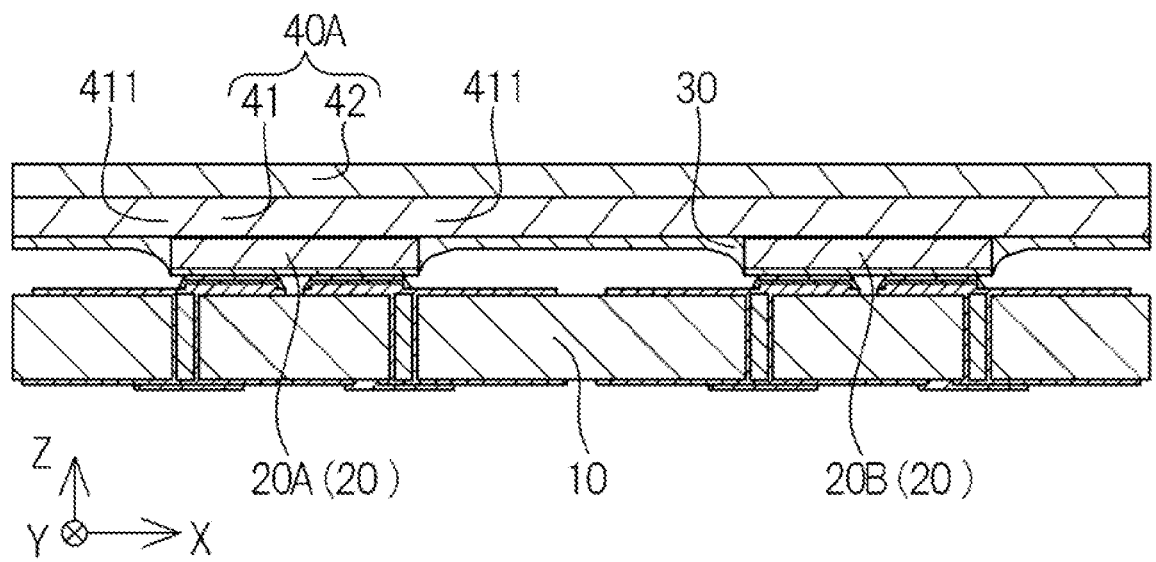
FIG. 5B is a schematic cross-sectional view showing the method of manufacturing the light emitting device according to the embodiment.
Figure 5C:
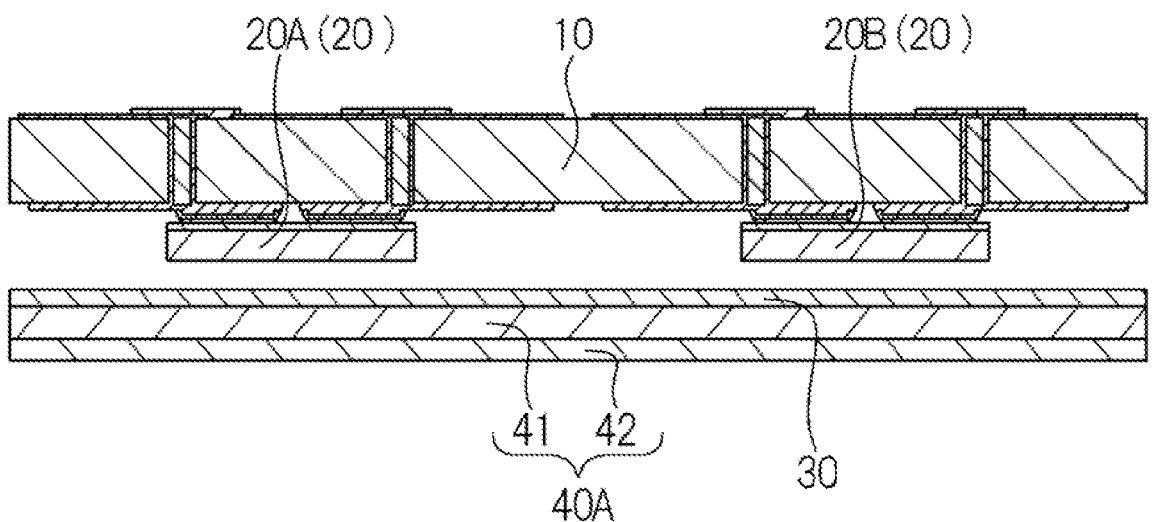
FIG. 5C is a schematic cross-sectional view showing the method of manufacturing the light emitting device according to the embodiment.

Referring to FIGS. 5A to 5C, an intermediate resin member securing step will be described. In the present specification, the resin member 40 in a form prior to singulation, described above, may be referred to as an intermediate resin member 40A. The intermediate resin member 40A is a plate-shaped member. In the present specification, the term "plate-shaped" includes not only a case of having flat upper and lower surfaces but also a case of having surface irregularities of 10 µm or less. As shown in FIG. 5A, the intermediate resin member 40A is disposed over the light emitting elements 20 in a plan view. As shown in FIGS. 5A and 5B, the intermediate resin member 40A includes first resin extended portions 411 that correspond to portions in a plan view extending in the first direction (X direction) from both the opposite sides (short sides) of respective light emitting elements 20. As shown in FIG. 5A, the intermediate resin member 40A may further include second resin extended portions 412 that correspond to portions in a plan view extending in the second direction (Y direction) from both the opposite sides (long sides) of respective light emitting elements 20. The intermediate resin member 40A and the light emitting element 20 are secured with the light-transmissive member 30. As shown in FIG. 5B, when the intermediate structure 101 includes the first light emitting element 20A and the second light emitting element 20B, it is preferred that the light-transmissive member 30 is in contact with the first light emitting element 20A, the second light emitting element 20B, and the intermediate resin member 40A. This allows for improving the bonding strength between the intermediate resin member 40A and each of the first light emitting element 20A and the second light emitting element 20B.

Any appropriate technique can be employed for securing the intermediate resin member 40A and the light emitting element 20 using the light-transmissive member 30. For example, as shown in FIG. 5C, the uncured light-transmissive member 30 may be disposed on the intermediate resin member 40A, and then the intermediate structure 101 located above the uncured light-transmissive member 30 may be moved downward. This allows the light emitting element 20 of the intermediate structure 101 to be in contact with the uncured light-transmissive member 30. The intermediate structure 101 is moved such that the uncured light-transmissive member 30 is brought in contact with the lateral surfaces of the light emitting element 20. After the intermediate structure 101 is brought into contact with the uncured light-transmissive member 30, the uncured light-transmissive member 30 is cured, so that the intermediate resin member 40A and the light emitting element 20 can be secured with the light-transmissive member 30.

Resin Member Forming Step

Figure 6A:
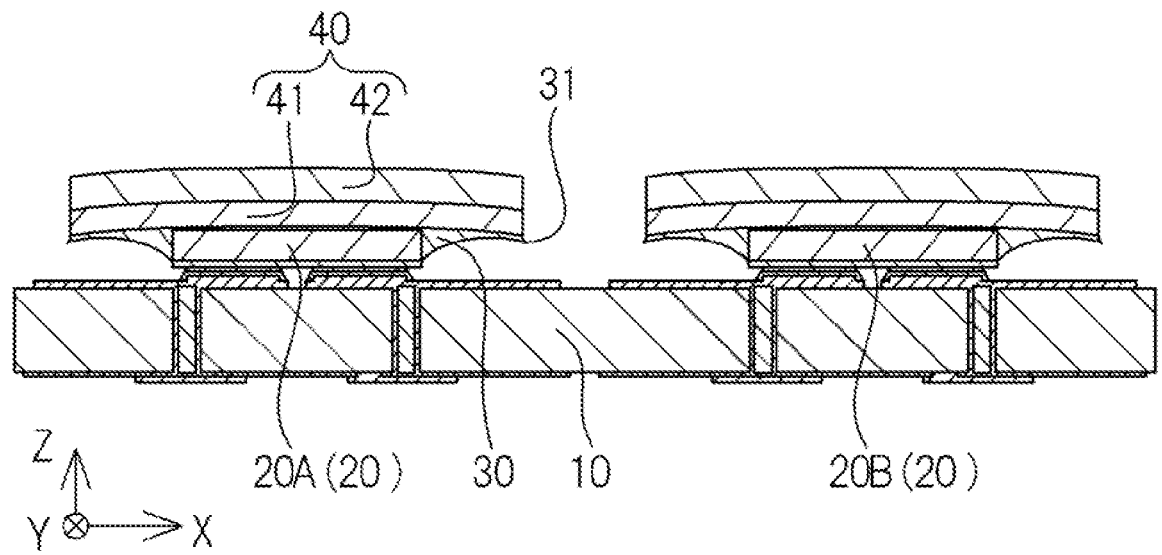
FIG. 6A is a schematic cross-sectional view showing the method of manufacturing the light emitting device according to the embodiment.
Figure 6B:
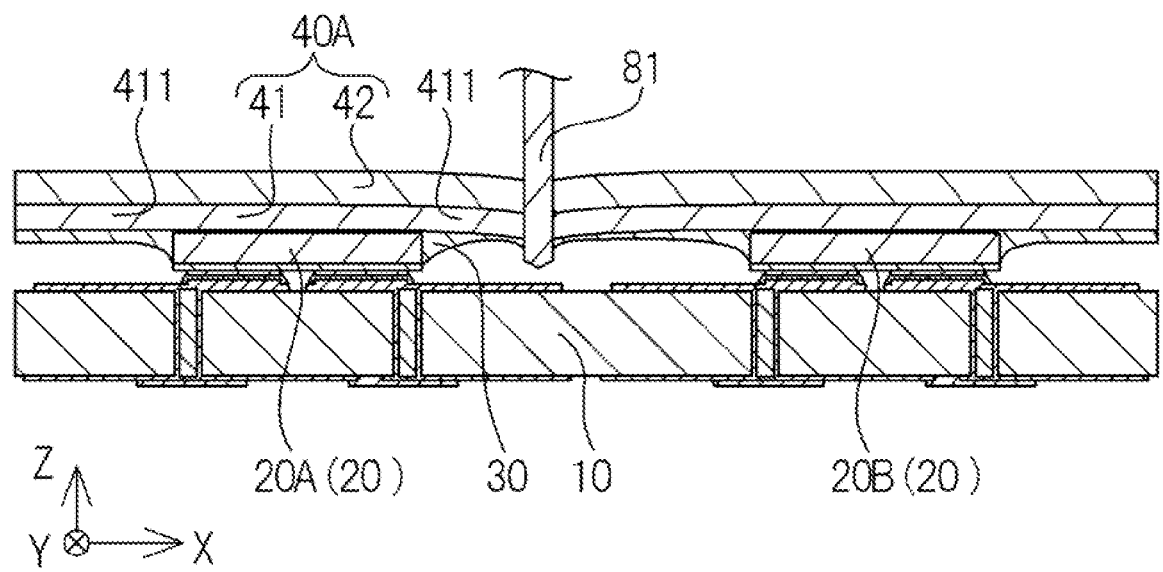
FIG. 6B is a schematic cross-sectional view showing the method of manufacturing the light emitting device according to the embodiment.

Referring to FIGS. 6A to 6D, a resin member obtaining step will be described. The intermediate resin member 40A is cut along the second direction (Y direction) at positions each of which overlaps a space between the support body 10 and corresponding first resin extended portions 411 and at each of which the maximum distance from a corresponding light emitting element 20 in the first direction (X direction) is longer than the maximum length of the corresponding light emitting element 20 in the second direction. This can result in the resin member 40 with a concave lower surface, as shown in FIG. 6A. The resin member 40 is a portion of the intermediate resin member 40A after being cut along the second direction (Y direction). Selecting appropriate hardness of the intermediate resin member 40A allows the resulting resin member 40 to have a lower surface of a concave shape, which is formed by the force exerted during cutting. The intermediate resin member 40A is cut at positions at each of which the maximum distance from a corresponding light emitting element 20 in the first direction (X direction) is longer than the maximum length of the corresponding light emitting element 20 in the second direction, which allows for increasing the bending moment generated in the intermediate resin member 40A as compared to when the intermediate resin member 40A is cut at positions at each of which the maximum distance from the corresponding light emitting element 20 in the first direction (X direction) is shorter than the maximum length of the corresponding light emitting element 20 in the second direction. This can facilitate bending the lower surface of the resin member 40 into a concave shape. As shown in FIG. 6B, when the intermediate structure 101 includes the first light emitting element 20A and the second light emitting element 20B, the intermediate resin member 40A may be cut along the second direction at a position between the first light emitting element 20A and the second light emitting element 20B. Known cutting techniques may be used. For example, the intermediate resin member 40A may be cut with a blade 81 as shown in FIG. 6B. A rotary blade may be used for the blade 81.

Figure 6C:
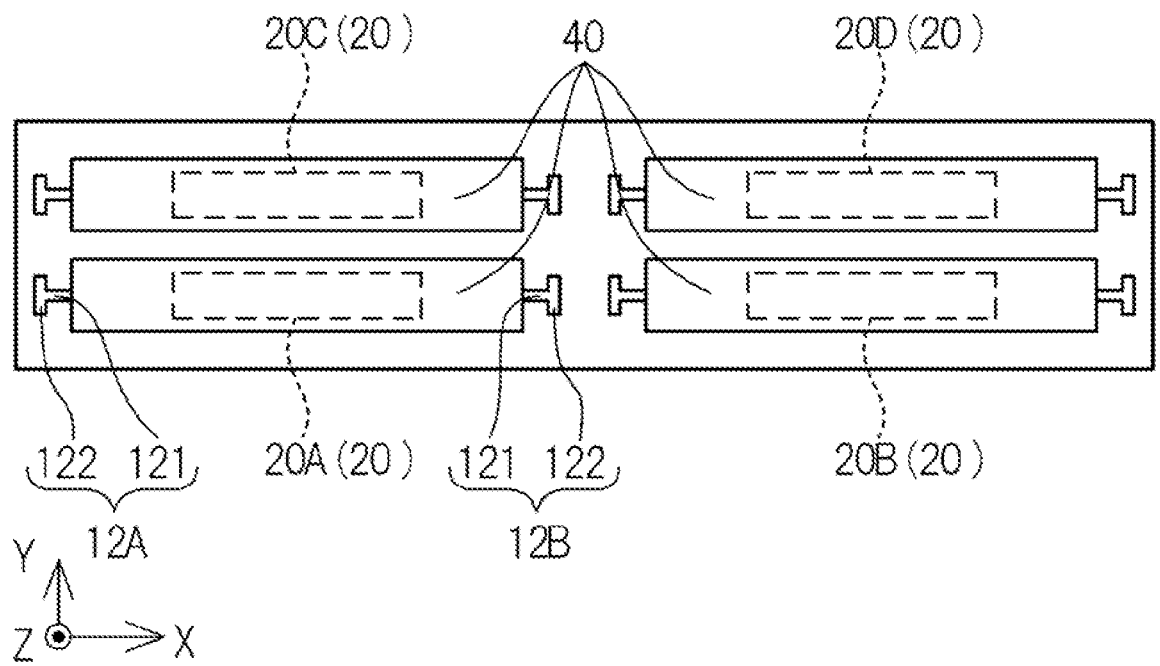
FIG. 6C is a schematic plan view showing the method of manufacturing the light emitting device according to the embodiment.
Figure 6D:
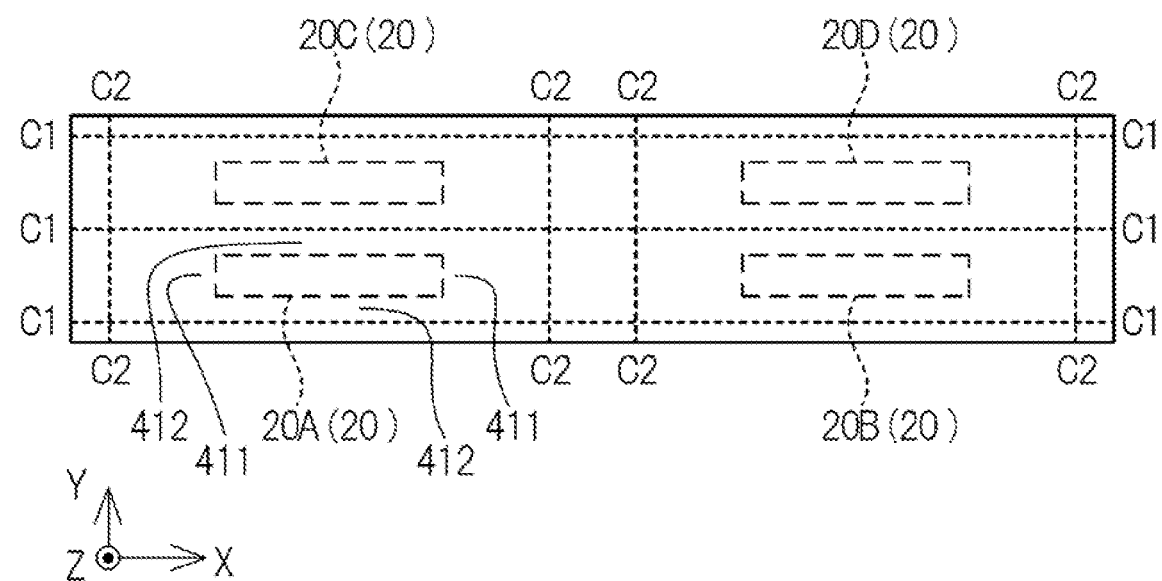
FIG. 6D is a schematic plan view showing the method of manufacturing the light emitting device according to the embodiment.

As shown in FIG. 6C, when the resin member 40 has a rectangular shape in a plan view, the intermediate resin member 40A may be cut along the first direction (X direction) and then along the second direction (Y direction), or may be cut along the second direction (Y direction) and then along the first direction (X direction). In the present specification, the term "rectangular" refers to a shape with two opposing sides that are parallel and other two opposing sides that are also parallel, and may include a shape with round or beveled corners. The intermediate resin member 40A is preferably cut such that the second resin extended portions 412 corresponding to portions in a plan view that extend in the second direction (Y direction) from both of the opposite sides of respective light emitting elements 20 in the second direction (Y direction) are cut along the first direction (X direction), and then the first resin extended portions 411 corresponding to portions in a plan view that extend in the first direction (X direction) from both of the opposite sides of respective light emitting elements 20 are cut along the second direction (Y direction). That is, as shown in FIG. 6D, it is preferred that the second resin extended portions 412 corresponding to portions in a plan view that extend in the second direction (Y direction) from both of the opposite sides of respective light emitting elements 20 be cut along a cutting line C1 extending in the first direction (X direction), and then the first resin extended portions 411 corresponding to portions in a plan view that extends in the first direction (X direction) from both of the opposite sides of respective light emitting elements 20 be cut along a cutting line C2 extending in the second direction (Y direction). In the present specification, the intermediate resin member prior to cutting the second resin extended portions 412 along the first direction (X direction) and cutting the first resin extended portions 411 along the second direction (Y direction) may be herein referred to as a "first intermediate resin member". Cutting the second resin extended portions 412, which correspond to portions in a plan view that extend in the second direction (Y direction) from both of the opposite sides of respective light emitting elements 20, along the first direction (X direction) allows for reducing the area of the first intermediate resin member in a Y-Z plane. This can facilitate the deformation of the first intermediate resin member when the first resin extended portions 411 are cut along the second direction (Y direction). Thus, the lower surface of the resin member 40 can be easily bent into a concave shape by performing such a cutting process, in which the second resin extended portions 412 that correspond to portions in a plan view that extend in the second direction (Y direction) from both of the opposite sides of respective light emitting elements 20 are cut along the first direction (X direction) and then the first resin extended portions 411 corresponding to portions in a plan view that extend in the first direction (X direction) from both of the opposite sides of respective light emitting elements 20 are cut along the second direction (Y direction).

As shown in FIG. 6C, it is preferred that the first wiring 12A include, at positions not overlapping the resin member 40 in a plan view, the first extended portion 121 extending in the first direction (X direction) and the second extended portion 122 extending in the second direction (Y direction) from the first extended portion 121. This structure allows for facilitating confirming the positional accuracy of the resin member 40 with the use of the first extended portion 121 and/or the second extended portion 122. Likewise, it is preferred that the second wiring 12B include, at positions not overlapping the resin member 40 in a plan view, the first extended portion 121 extending in the first direction (X direction) and the second extended portion 122 extending in the second direction (Y direction) from the first extended portion 121.

As shown in FIG. 6B, it is preferred that the light-transmissive member 30 be cut along with the cutting of the intermediate resin member 40A in the second direction (Y direction). Selecting appropriate hardness of the light-transmissive member 30 allows the light-transmissive member 30 to be elongated by the force exerted during cutting and thus the light-transmissive extended portion 31 located outside of the resin member 40 is formed. The light-transmissive extended portion 31 may be located below a plane including the upper surface of the light emitting element 20. A step of removing shavings or the like generated during cutting of the intermediate resin member 40A may be performed.

Covering Member Forming Step

Figure 7A:
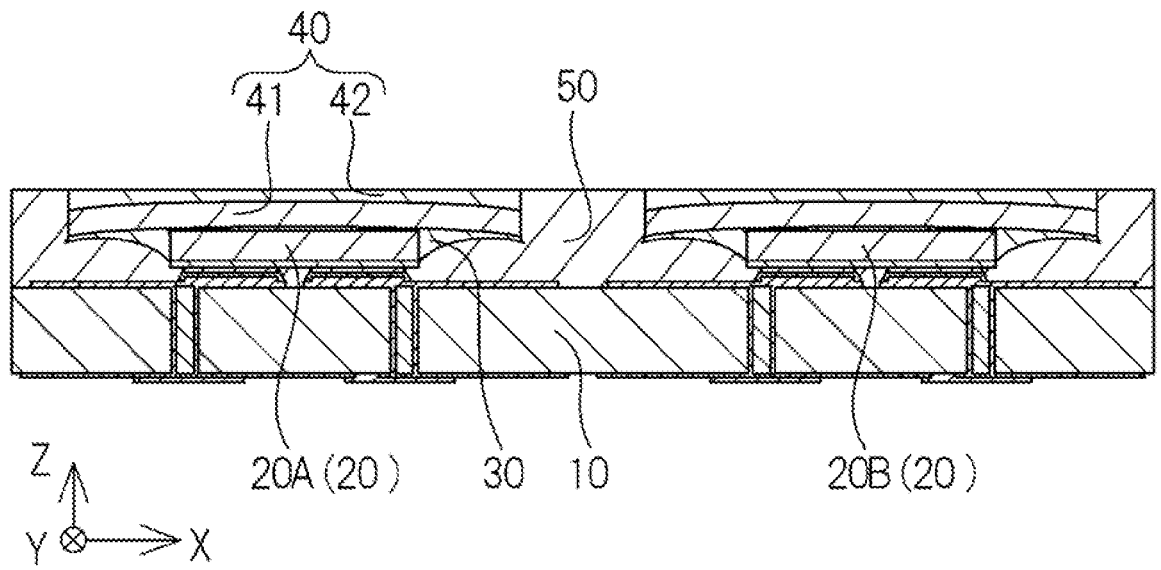
FIG. 7A is a schematic cross-sectional view showing the method of manufacturing the light emitting device according to the embodiment.
Figure 7B:
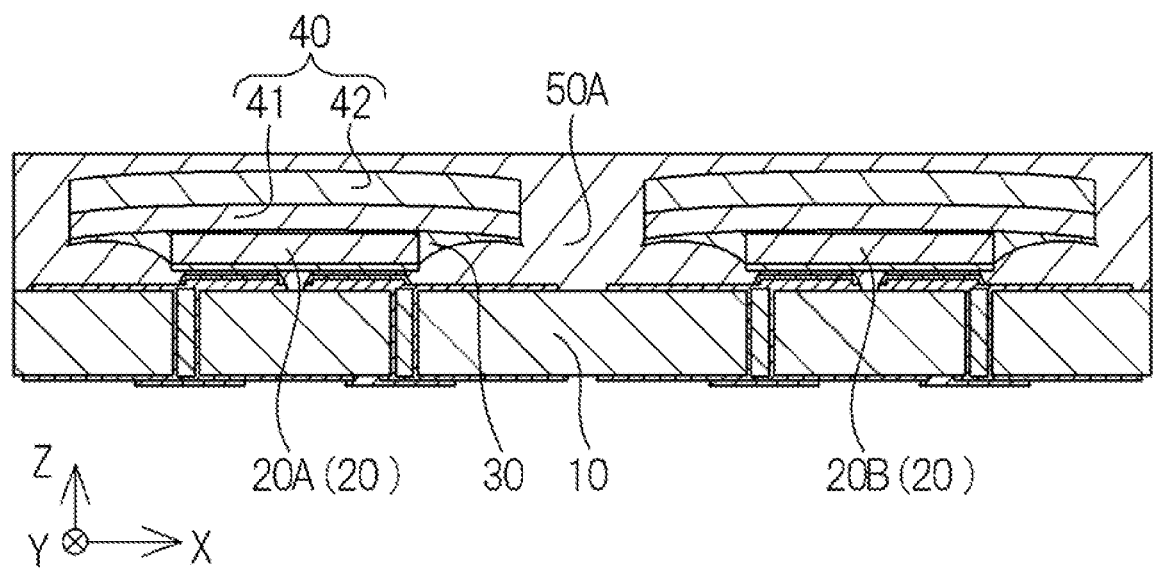
FIG. 7B is a schematic cross-sectional view showing the method of manufacturing the light emitting device according to the embodiment.

Referring to FIGS. 7A and 7B, a covering member forming step will be described. The covering member 50 is formed to cover the lateral surfaces of the resin member 40 with the upper surface of the resin member 40 exposed. The covering member 50 may also cover the upper surface of the support body 10 and the lateral surfaces of the light emitting element 20. For forming the covering member 50, a known technique such as transfer molding, compression molding, potting, printing, etc., can be used.

As shown in FIG. 7B, an intermediate covering member 50A covering the upper surfaces of the resin members 40 may be formed. A portion of each intermediate covering member 50A may be removed to obtain the covering member 50 from which the upper surface of each resin member 40 is exposed as shown in FIG. 7A. The covering member 50 is the intermediate covering member 50A after a portion of the intermediate covering member 50A has been removed to expose the upper surface of the resin member 40. A known technique such as grinding, blasting, etc., may be used for removing a portion of the intermediate covering member 50A. A portion of the resin member 40 may also be removed along with the removal of a portion of the intermediate covering member 50A. When the resin member 40 includes the phosphor-containing layer 41 and the phosphor-free layer 42, it is preferred to remove a portion of the phosphor-free layer 42 and not to remove the phosphor-containing layer 41. This allows for reducing or preventing unevenness in the emission color of the light emitting device.

Singulation Step

Figure 8:
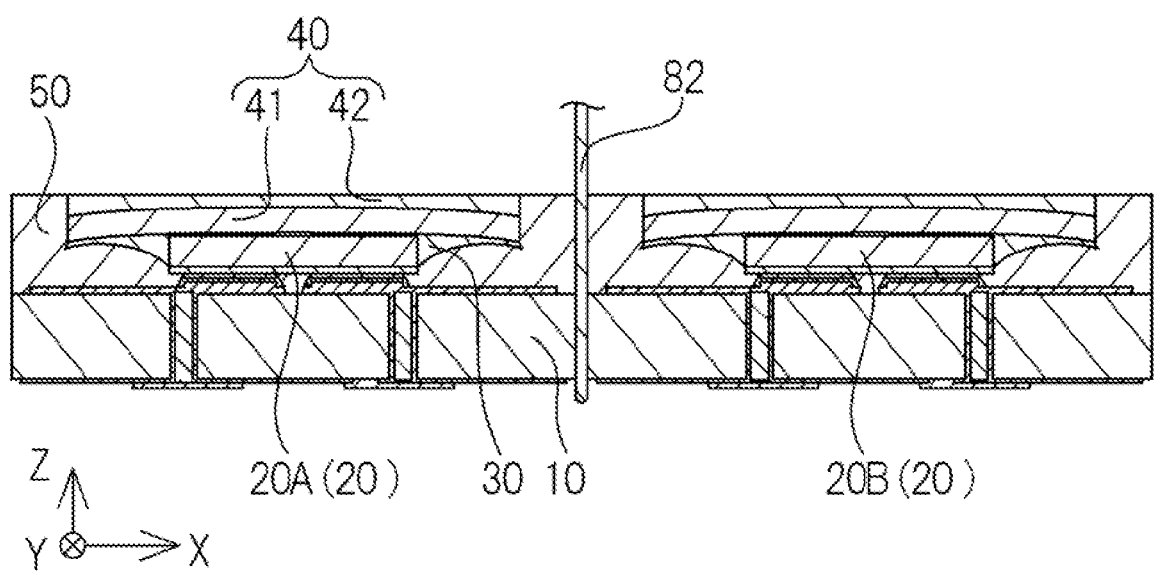
FIG. 8 is a schematic cross-sectional view showing the method of manufacturing the light emitting device according to the embodiment.

Referring to FIG. 8, a singulation step will be described. The method of manufacturing the light emitting device according to one embodiment of the present disclosure may include a singulation step of removing portions of the support body 10 and the covering member 50 after the covering member forming step. A known technique such as cutting with a blade, cutting with a laser beam, etc., may be used to remove portions of the support body 10 and the covering member 50. For example, a blade 82 may be used to cut the support body 10 and the covering member 50 to remove portions thereof, as shown in FIG. 8. Removing portions of the support body 10 and the covering member 50 by cutting allows for facilitating allowing the cut surfaces of the support body 10 and the covering member 50 to be flush with each other. Accordingly, a reduction in the size of the light emitting device can be facilitated.

The light emitting device according to one embodiment of the present disclosure can be used for various applications, such as a light source for LCD backlight, an illumination light source, a vehicle light source, a display light source, etc.

What is claimed is:

1. A method of manufacturing a light emitting device, the method comprising:
    providing an intermediate structure including
        at least one light emitting element having an upper surface extending in a first direction and a second direction perpendicular to the first direction, the first direction being a longitudinal direction, and the second direction being a transverse direction, and
        a support body on which the at least one light emitting element is disposed;
    securing a plate-shaped intermediate resin member and the at least one light emitting element with a light-transmissive member such that the intermediate resin member is disposed over the at least one light emitting element and includes first resin extended portions extending outwardly in the first direction respectively from both short sides of the at least one light emitting element in a plan view;
    cutting the intermediate resin member at cutting positions along the second direction to obtain at least one resin member with a concave lower surface, the cutting positions respectively overlapping spaces between the first resin extended portions and the support body in the plan view, a maximum distance from the at least one light emitting element to a respective one of the cutting positions in the first direction being longer than a maximum length of the at least one light emitting element in the second direction; and
    forming a covering member to cover lateral surfaces of the at least one resin member such that an upper surface of the at least one resin member is exposed from the covering member.

2. The method of manufacturing a light emitting device according to claim 1, wherein
    the cutting of the intermediate resin member includes forming a light-transmissive extended portion in the light-transmissive member to be located outward of the resin member in the plan view.

3. The method of manufacturing a light emitting device of claim 2, wherein
    the light-transmissive extended portion is located below a plane including the upper surface of the at least one light emitting element.

4. The method of manufacturing a light emitting device of claim 1, wherein
    the securing of the intermediate resin member includes securing the intermediate resin member and the at least one light emitting element with the light-transmissive member such that the intermediate resin member includes a second resin extended portions extending outwardly in the second direction respectively from both long sides of the at least one light emitting element in the plan view, and
    the cutting of the intermediate resin member further includes cutting the second resin extended portion of the intermediate resin member along the first direction before the cutting of the intermediate resin member along the second direction.

5. The method of manufacturing a light emitting device of claim 1, wherein
    a portion of the at least one resin member is located below a plane including the upper surface of the at least one light emitting element.

6. The method of manufacturing a light emitting device of claim 1, wherein
    in a cross-sectional view, a maximum thickness of the light-transmissive member at a corresponding end of the at least one resin member is in a range of 0.01 times to 0.1 times a maximum distance between the at least one light emitting element and the corresponding end of the at least one resin member in the first direction.

7. The method of manufacturing a light emitting device of claim 1, wherein
    the providing of the intermediate structure includes providing the intermediate structure including a first light emitting element and a second light emitting element as the at least one light emitting element,
    the securing of the intermediate resin member includes bringing the light-transmissive member into contact with the first light emitting element, the second light emitting element, and the intermediate resin member, and
    the cutting of the intermediate resin member includes cutting the intermediate resin member along the second direction at the cutting positions including a position between the first light emitting element and the second light emitting element.

8. The method of manufacturing a light emitting device of claim 1, wherein
    the forming of the covering member includes disposing an intermediate covering member to cover the upper surface of the at least one resin member and then removing a portion of the intermediate covering member to obtain the covering member.

9. The method of manufacturing a light emitting device of claim 1, further comprising
    after the forming of the covering member, performing singulation by removing at least a portion of each of the support body and the covering member.

10. The method of manufacturing a light emitting device of claim 1, wherein
the forming of the covering member includes forming the covering member so that a portion of an upper surface of the covering member is located higher than an upper surface of the at least one resin member.

11. A light emitting device comprising:
a support body;
a light emitting element disposed on the support body, the light emitting element having an upper surface extending in a first direction and a second direction perpendicular to the first direction, the first direction being a longitudinal direction, and the second direction being a transverse direction;
a light-transmissive member covering lateral surfaces of the light emitting element;
a resin member covering the upper surface of the light emitting element and an upper surface of the light-transmissive member, the resin member having a concave lower surface; and
a covering member covering lateral surfaces of the resin member with an upper surface of the resin member being exposed from the covering member, wherein
a maximum length of each of portions of the resin member disposed outward of the light emitting element in the first direction is greater than a maximum length of the light emitting element in the second direction in a plan view, wherein
the light-transmissive member includes a light-transmissive extended portion located outward of the resin member in the plan view, and
the light-transmissive extended portion is disposed between portions of the covering member in a third direction perpendicular to the first direction and the second direction.

12. The light emitting device of claim 11, wherein
the light-transmissive extended portion is located below a plane including the upper surface of the light emitting element.

13. The light emitting device of claim 11, wherein
the light-transmissive extended portion is located above a plane including the lower surface of the light emitting element.

14. The light emitting device of claim 11, wherein
in a cross-sectional view, a maximum thickness of the light-transmissive member at a corresponding end of the resin member is in a range of 0.01 times to 0.1 times a maximum distance between the light emitting element and the corresponding end of the resin member in the first direction.

15. The light emitting device of claim 11, wherein
a portion of the resin member between an uppermost portion of the concave lower surface and a lowermost portion of the concave lower surface in the third direction has a length in a range of 20 μm to 100 μm.

16. The light emitting device of claim 11, wherein
a maximum length from the light emitting element to a corresponding end of the resin member in the second direction is shorter than a maximum length of the light emitting element in the second direction.

17. The light emitting device of claim 12, wherein
the light-transmissive extended portion is located above a plane including the lower surface of the light emitting element.

18. The light emitting device of claim 12, wherein
in a cross-sectional view, a maximum thickness of the light-transmissive member at a corresponding end of the resin member is in a range of 0.01 times to 0.1 times a maximum distance between the light emitting element and the corresponding end of the resin member in the first direction.

19. The light emitting device of claim 12, wherein
a portion of the resin member between an uppermost portion of the concave lower surface and a lowermost portion of the concave lower surface in the third direction has a length in a range of 20 μm to 100 μm.

20. The light emitting device of claim 12, wherein
a maximum length from the light emitting element to a corresponding end of the resin member in the second direction is shorter than a maximum length of the light emitting element in the second direction.

* * * * *